US011296091B2

(12) United States Patent
Chang et al.

(10) Patent No.: US 11,296,091 B2
(45) Date of Patent: Apr. 5, 2022

(54) DYNAMIC RANDOM ACCESS MEMORY AND METHOD OF FORMING THE SAME

(71) Applicant: Powerchip Semiconductor Manufacturing Corporation, Hsinchu (TW)

(72) Inventors: Li-Peng Chang, Hsinchu (TW); San-Jung Chang, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 17/024,717

(22) Filed: Sep. 18, 2020

(65) Prior Publication Data

US 2022/0059546 A1 Feb. 24, 2022

(30) Foreign Application Priority Data

Aug. 24, 2020 (TW) .................................. 109128793

(51) Int. Cl.
*H01L 27/108* (2006.01)
*H01L 21/764* (2006.01)
*H01L 21/768* (2006.01)

(52) U.S. Cl.
CPC .... *H01L 27/10885* (2013.01); *H01L 21/7682* (2013.01); *H01L 27/10814* (2013.01);
(Continued)

(58) Field of Classification Search
CPC ......... H01L 27/10885; H01L 27/10876; H01L 27/10823; H01L 27/10855; H01L 21/7682;
(Continued)

(56) References Cited

U.S. PATENT DOCUMENTS

2010/0072542 A1* 3/2010 Kadoya ............. H01L 21/28512
257/330
2020/0168611 A1 5/2020 Jeon et al.
2020/0312707 A1* 10/2020 Chen ................ H01L 21/02271

FOREIGN PATENT DOCUMENTS

TW 201701469 1/2017
TW 201906089 2/2019
(Continued)

OTHER PUBLICATIONS

J.M. Park, et al., "20nm DRAM: A new beginning of another revolution." IEDM15-678, Dec. 7-9, 2015, pp. 26.5.1-26.5.4.
(Continued)

*Primary Examiner* — Samuel Park
(74) *Attorney, Agent, or Firm* — JCIPRNET

(57) ABSTRACT

Provided is a dynamic random access memory (DRAM) including a substrate, a plurality of word-line sets, a plurality of bit-line structures, a plurality of capacitors, a plurality of capacitor contacts, and a plurality of air gaps. The substrate has a plurality of active areas. The word-line sets extend along a Y direction and disposed in the substrate. The bit-line structures extend along a X direction, disposed on the substrate, and across the word-line sets. The capacitors are respectively disposed at two terminals of the active areas. The capacitor contacts are respectively disposed between the capacitors and the active regions. The air gaps are disposed in a plurality of spaces enclosed by the bit-line structures and the capacitor contacts. A method of forming a DRAM is also provided.

10 Claims, 36 Drawing Sheets

(52) U.S. Cl.
CPC .. *H01L 27/10823* (2013.01); *H01L 27/10855* (2013.01); *H01L 27/10876* (2013.01)

(58) Field of Classification Search
CPC ......... H01L 27/10814; H01L 2924/143; H01L 2924/1435; H01L 21/82; H01L 27/10; H01L 27/11; H01L 21/8229; H01L 21/8239; H01L 27/222; H01L 27/24; H01L 29/685; H01L 29/792; H01L 29/8615; H01L 45/04; H01L 2027/11838; H01L 2924/13089; H01L 2924/14; H01L 21/76897; H01L 2924/00; H01L 2924/0002; H01L 27/10888; H01L 21/764; H01L 21/76831; H01L 23/528; H01L 23/5329; H01L 21/76877; H01L 2221/1063; H01L 21/76802; H01L 21/76834; H01L 23/535; H01L 27/10852; H01L 27/10891; H01L 27/2436; H01L 29/4236; H01L 23/53271
See application file for complete search history.

(56) References Cited

FOREIGN PATENT DOCUMENTS

| | | |
|---|---|---|
| TW | 202025400 | 7/2020 |
| TW | 202030861 | 8/2020 |

OTHER PUBLICATIONS

Office Action of Taiwan Counterpart Application, dated Apr. 7, 2021, pp. 1-6.

\* cited by examiner

DYNAMIC RANDOM ACCESS MEMORY AND METHOD OF FORMING THE SAME

CROSS-REFERENCE TO RELATED APPLICATION

This application claims the priority benefit of Taiwan application serial no. 109128793, filed on Aug. 24, 2020. The entirety of the above-mentioned patent application is hereby incorporated by reference herein and made a part of this specification.

BACKGROUND OF THE INVENTION

Field of the Invention

The present invention relates to a memory device and a method of forming the same, and more particularly to a dynamic random access memory and a method of forming the same.

Description of Related Art

A dynamic random access memory (DRAM) is a volatile memory formed by a plurality of memory cells. Each of the memory cells is mainly composed of a transistor and a capacitor controlled by the transistor, and the memory cells are electrically connected with one another through word lines and bit lines. In order to improve the integration of DRAM to increase the operating speed of the device and to meet the consumers' demand for miniaturization of electronic devices, embedded word line DRAM has been developed in recent years for the aforementioned purposes.

With the advancement of science and technology, various electronic products are developing towards the trend of lightness, thinness and compact size. However, under this trend, the critical dimension of the DRAM is also reduced, which result in many challenges for the DRAM process. For example, as the integration density of the DRAM continues to increase, the crosstalk between the memory cells, i.e., the bit line coupling, becomes more and more serious, thereby affecting the operation of the DRAM.

SUMMARY OF THE INVENTION

The invention provides a dynamic random access memory (DRAM) and a method of forming the same in which can reduce the parasitic capacitance between adjacent bit-line structures, so as to improve the coupling interference between adjacent bit-line structures, thereby enhancing the reliability of the DRAM.

The invention provides a dynamic random access memory (DRAM) including a substrate, a plurality of word-line sets, a plurality of bit-line structures, a plurality of capacitors, a plurality of capacitor contacts, and a plurality of air gaps. The substrate has a plurality of active areas. The word-line sets extend along a Y direction and disposed in the substrate. The bit-line structures extend along a X direction, disposed on the substrate, and across the word-line sets. The capacitors are respectively disposed at two terminals of the active areas. The capacitor contacts are respectively disposed between the capacitors and the active regions. The air gaps are disposed in a plurality of spaces enclosed by the bit-line structures and the capacitor contacts.

In one embodiment of the invention, each word-line set comprises two embedded word lines.

In one embodiment of the invention, each air gap has a width is within a width of a corresponding word-line set.

In one embodiment of the invention, each capacitor includes: a lower electrode being cup-shaped; an upper electrode disposed on the lower electrode; and a capacitor dielectric layer disposed between the lower and upper electrodes.

In one embodiment of the invention, two adjacent capacitors share a same upper electrode.

The invention provides a method of forming a memory device including: providing a substrate having a plurality of active areas; forming a plurality of bit-line structures on the substrate; forming a sacrificial layer between the plurality of bit-line structures; forming a first dielectric layer on the sacrificial layer; forming a plurality of trenches in the first dielectric layer to expose the sacrificial layer; performing a first etching process to remove the sacrificial layer, so as to form a plurality of air gaps under the first dielectric layer between the plurality of bit-line structures; forming spacers on sidewalls of the plurality of trenches to seal the plurality of air gaps; respectively forming a plurality of capacitor contacts on two terminals of the plurality of active areas; and respectively forming a plurality of capacitors on the plurality of capacitor contacts.

In one embodiment of the invention, the forming the spacers includes filling the plurality of trenches with a second dielectric layer; and performing a second etching process to remove a portion of the second dielectric layer, so as to expose a top surface of the substrate, wherein the spacers cover the sidewalls of the plurality of trenches and extend into a position under the first dielectric layer.

In one embodiment of the invention, before forming the plurality of bit-line structures, the method further includes forming a plurality of word-line sets in the substrate, wherein each word-line set comprises two embedded word lines.

In one embodiment of the invention, before forming the plurality of word-line sets, the method further includes forming a plurality of isolation structures in the substrate to divide the substrate into the plurality of active areas, wherein the plurality of active areas are configured in a shape of band and arranged in an array.

In one embodiment of the invention, the forming the plurality of capacitor contacts includes: forming a plurality of conductive layers in the plurality of trenches, wherein a top surface of the plurality of conductive layers is lower than a top surface of the first dielectric layer; forming a third dielectric layer to conformally cover the first dielectric layer and the plurality of conductive layers, wherein the third dielectric layer is a continuous uneven structure; performing a third etching process to form a plurality of openings exposing the plurality of isolation structures, wherein the plurality of openings divide the plurality of conductive layers into the plurality of capacitor contacts; and forming a plurality of dielectric structures in the plurality of openings to connect the plurality of isolation structures.

Based on the above, in the embodiment of the present invention, the air gaps are formed between the bit-line structures to effectively reduce the parasitic capacitance between the bit-line structures, thereby improving the coupling interference between the bit-line structures and enhancing the reliability of the DRAM.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
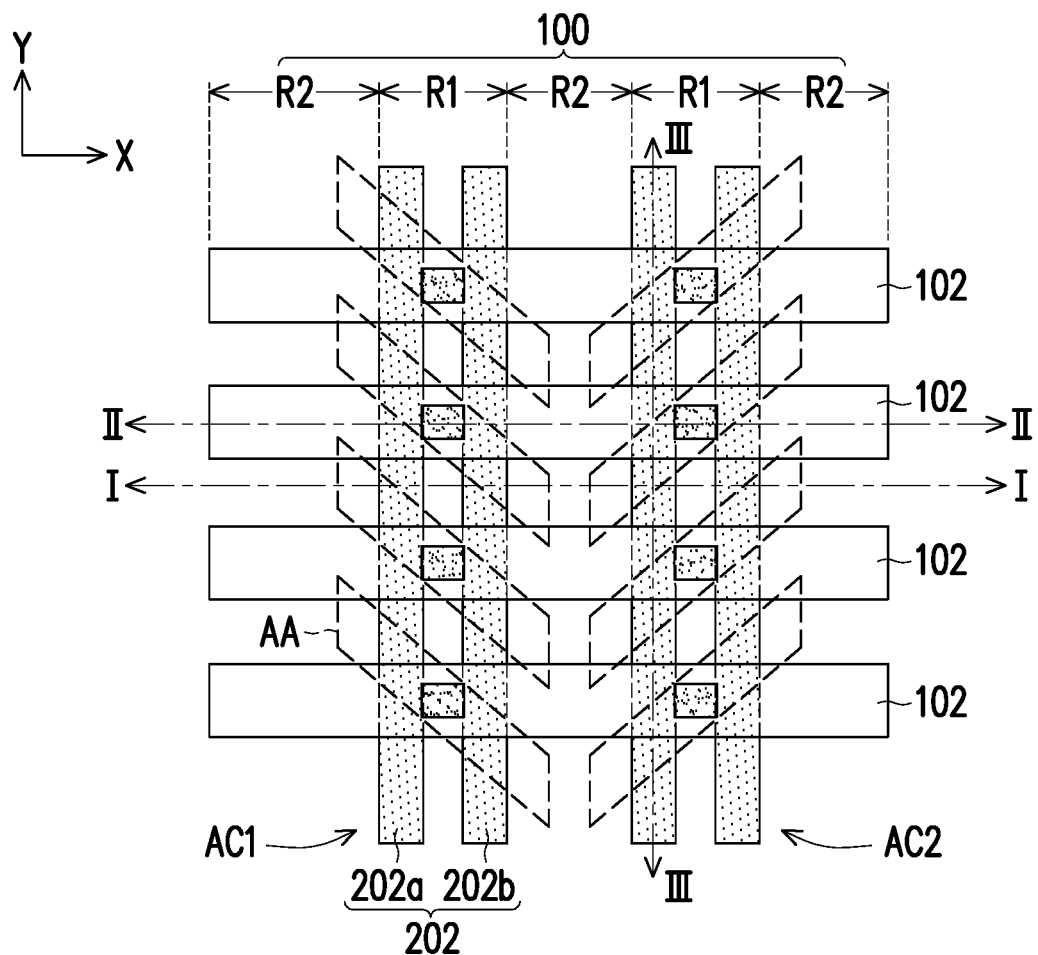
FIG. 1A to FIG. 1N are schematic top views illustrating a manufacturing process of a memory device according to an embodiment of the invention.
Figure 1B:
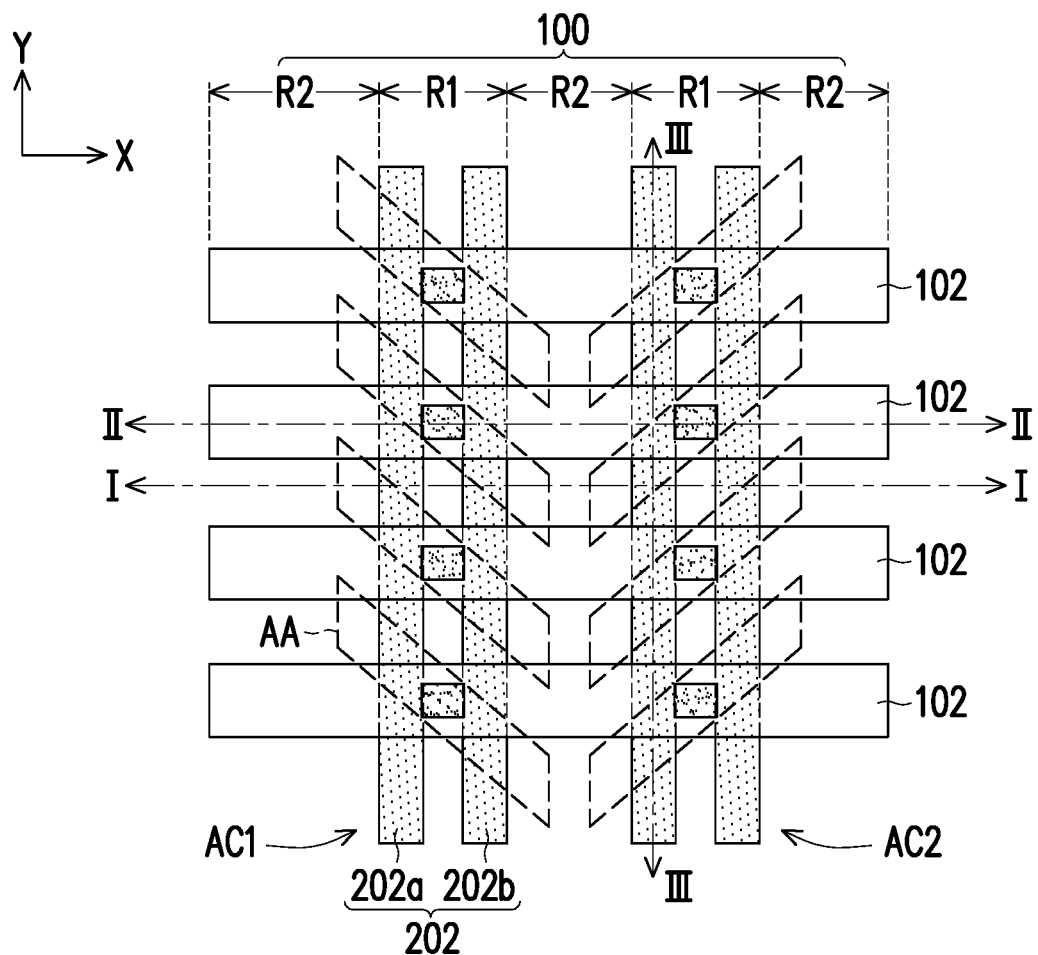
Figure 1C:
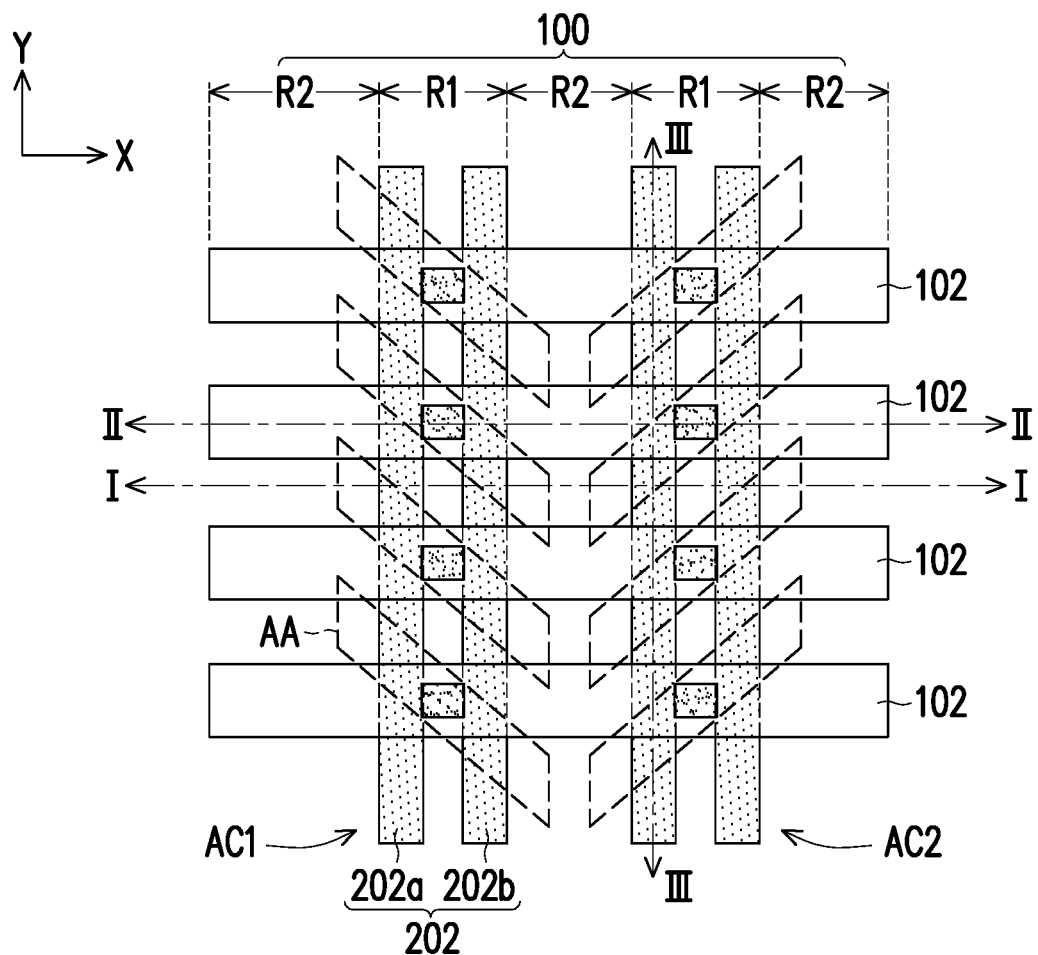
Figure 1D:
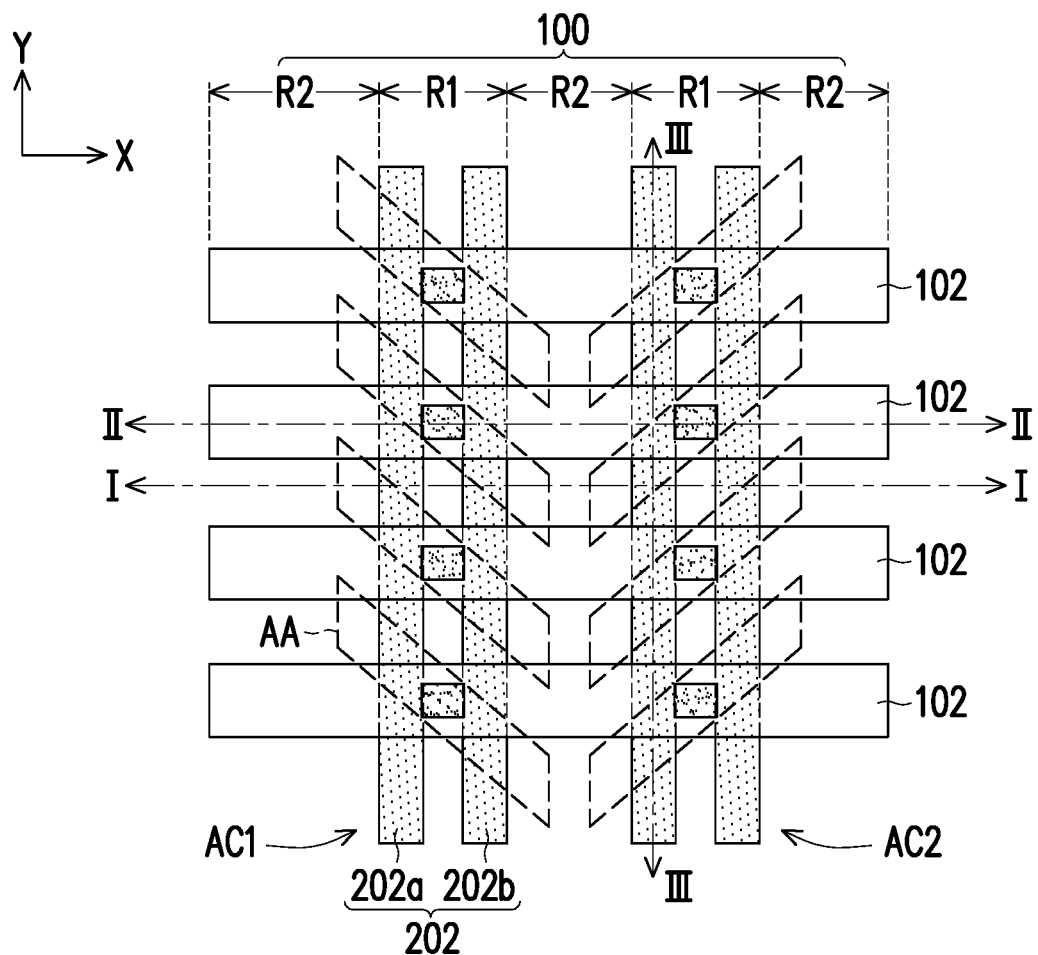

The invention is more blanketly described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

Figure 1E:
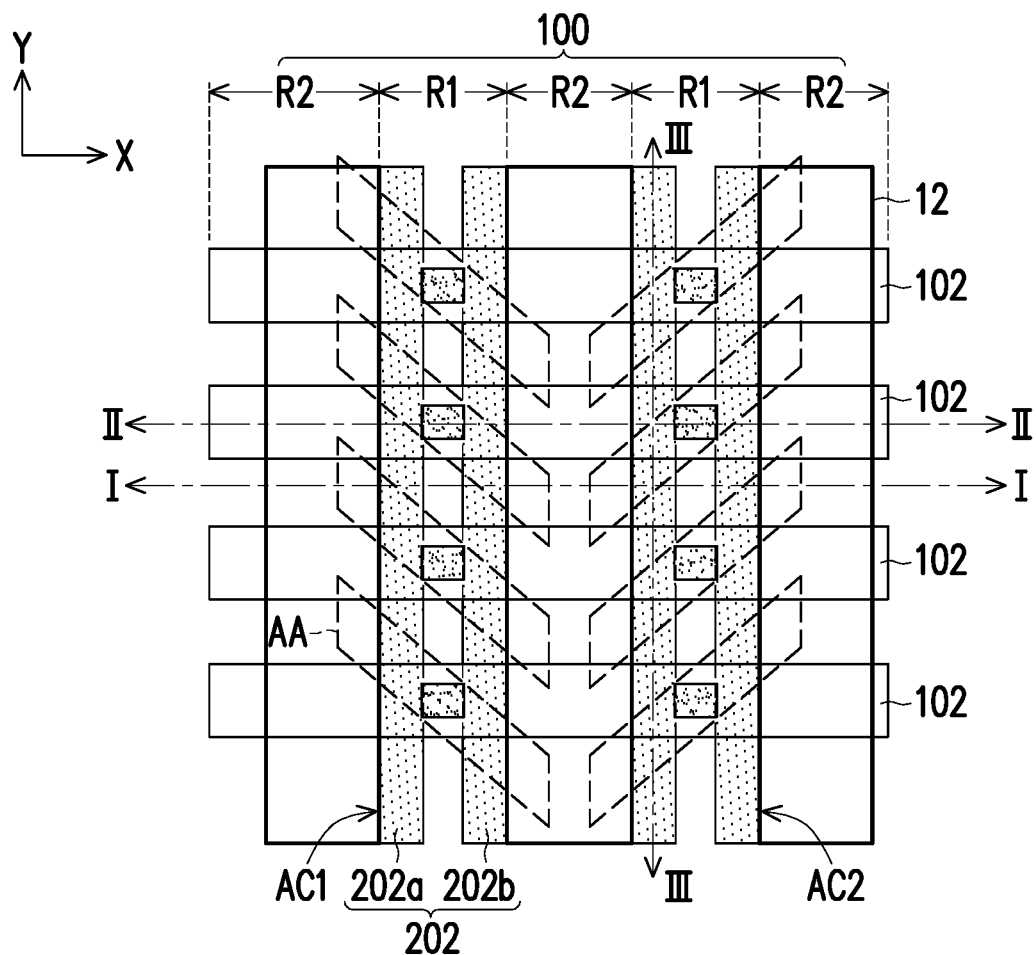
Figure 1F:
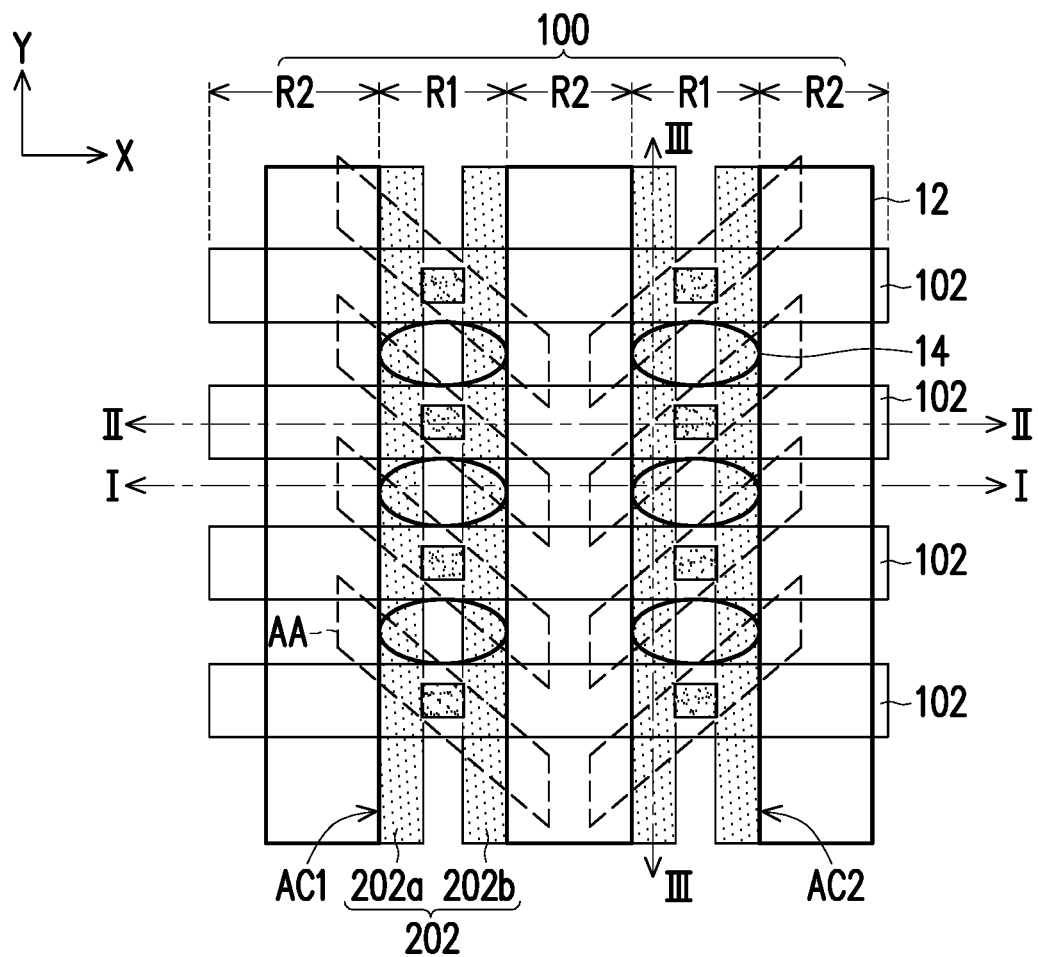
Figure 1G:
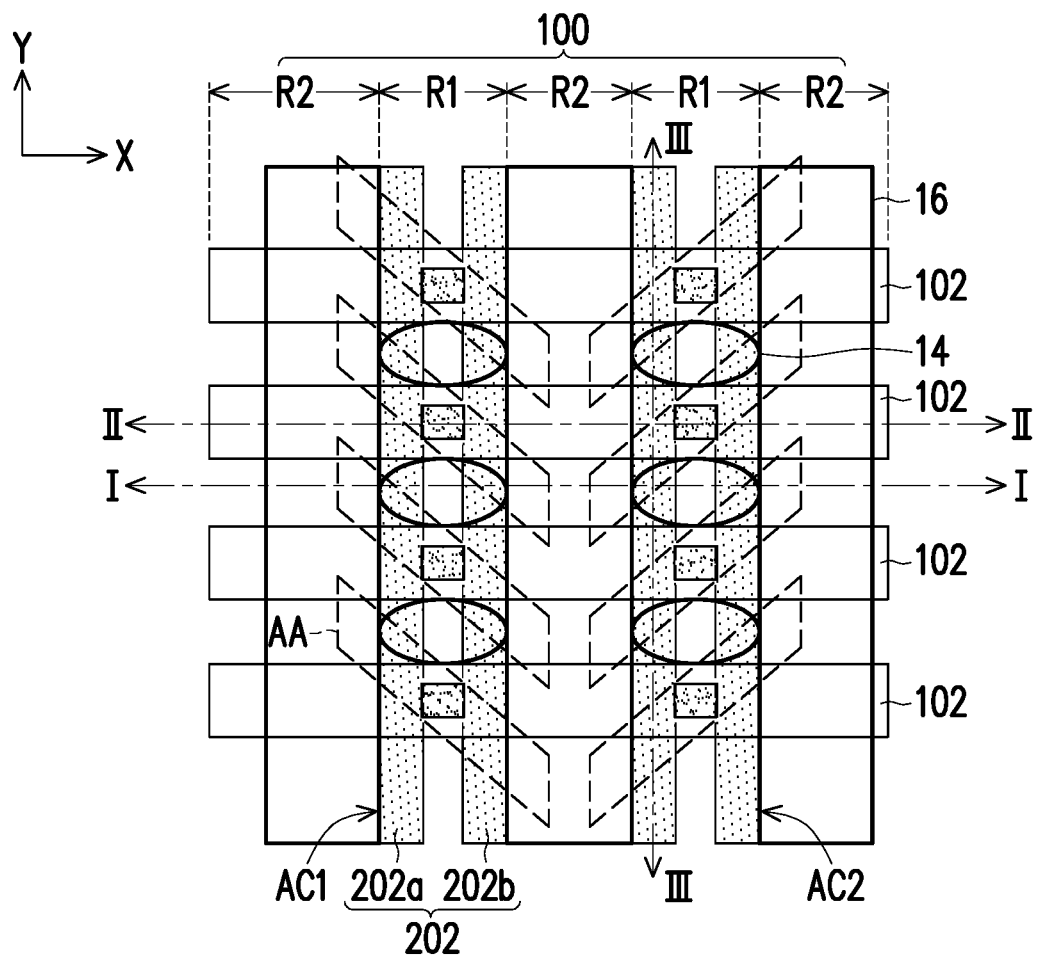
Figure 1H:
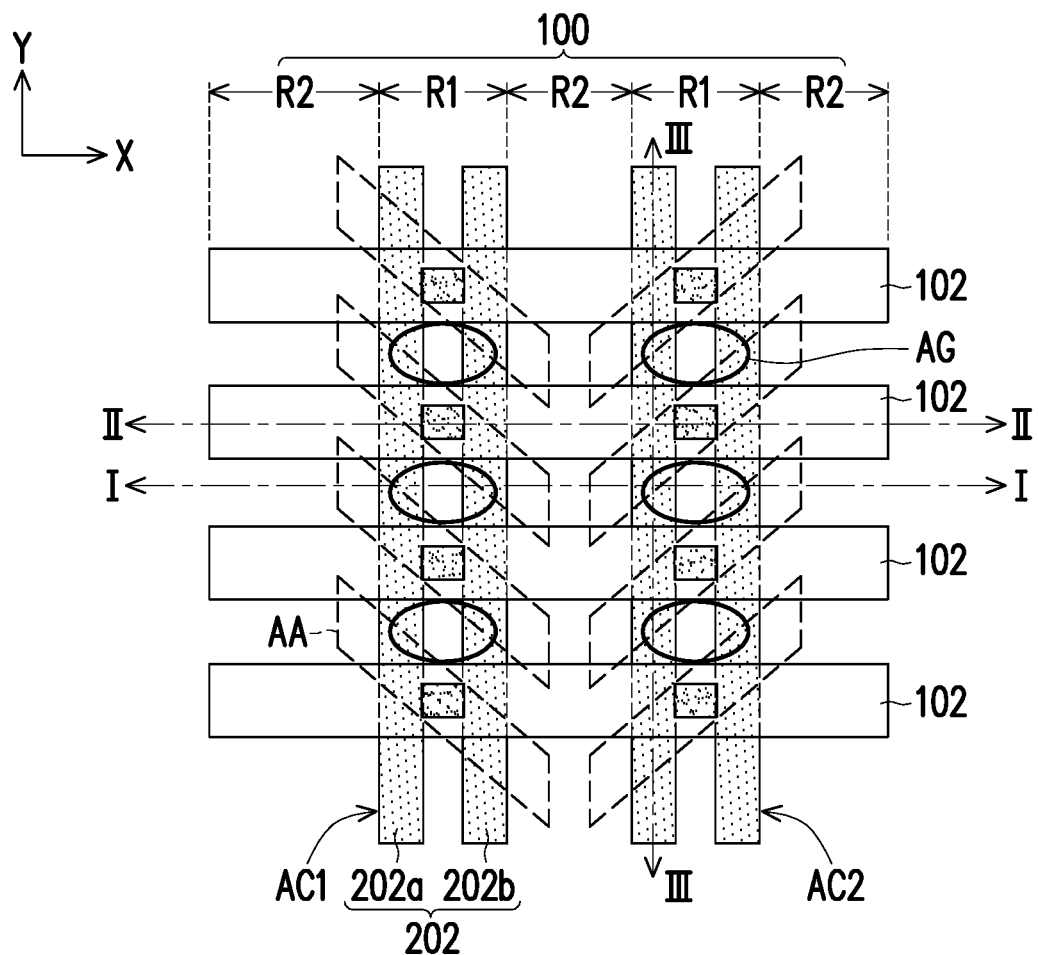
Figure 1I:
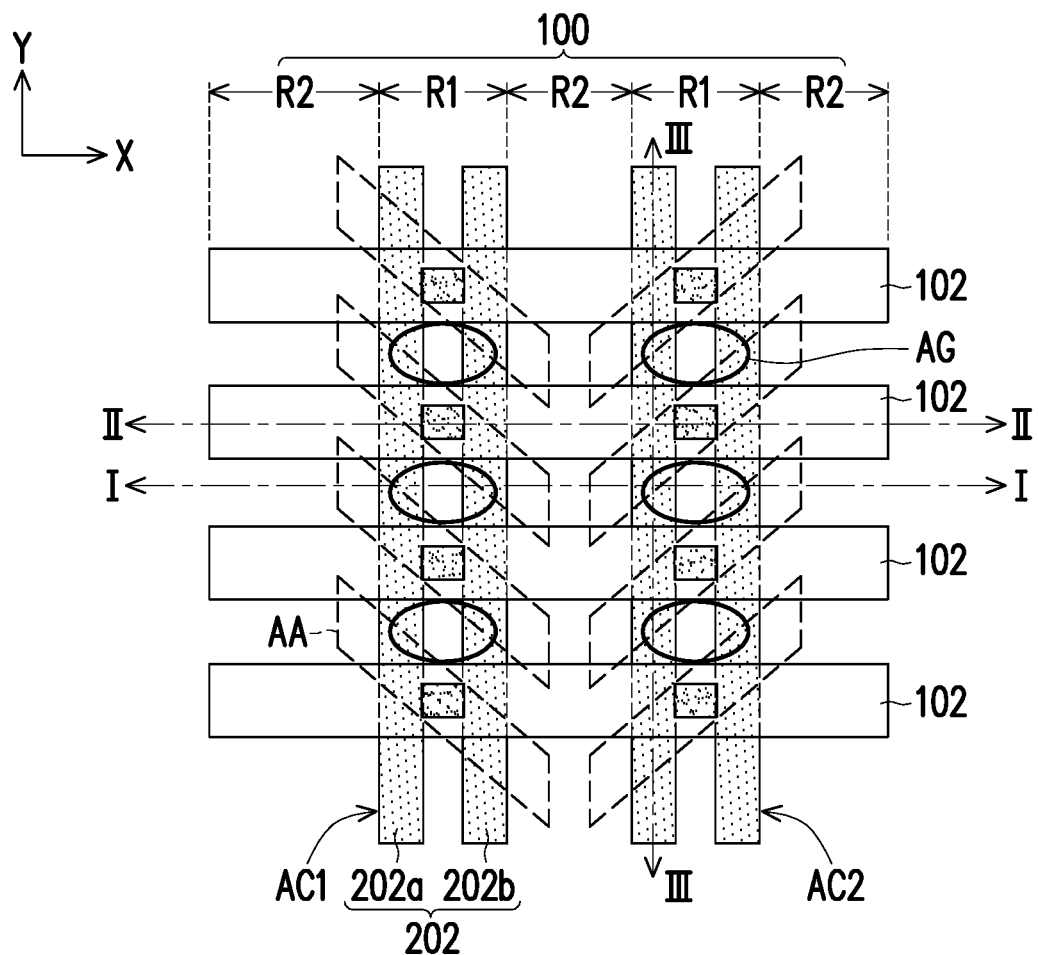
Figure 1J:
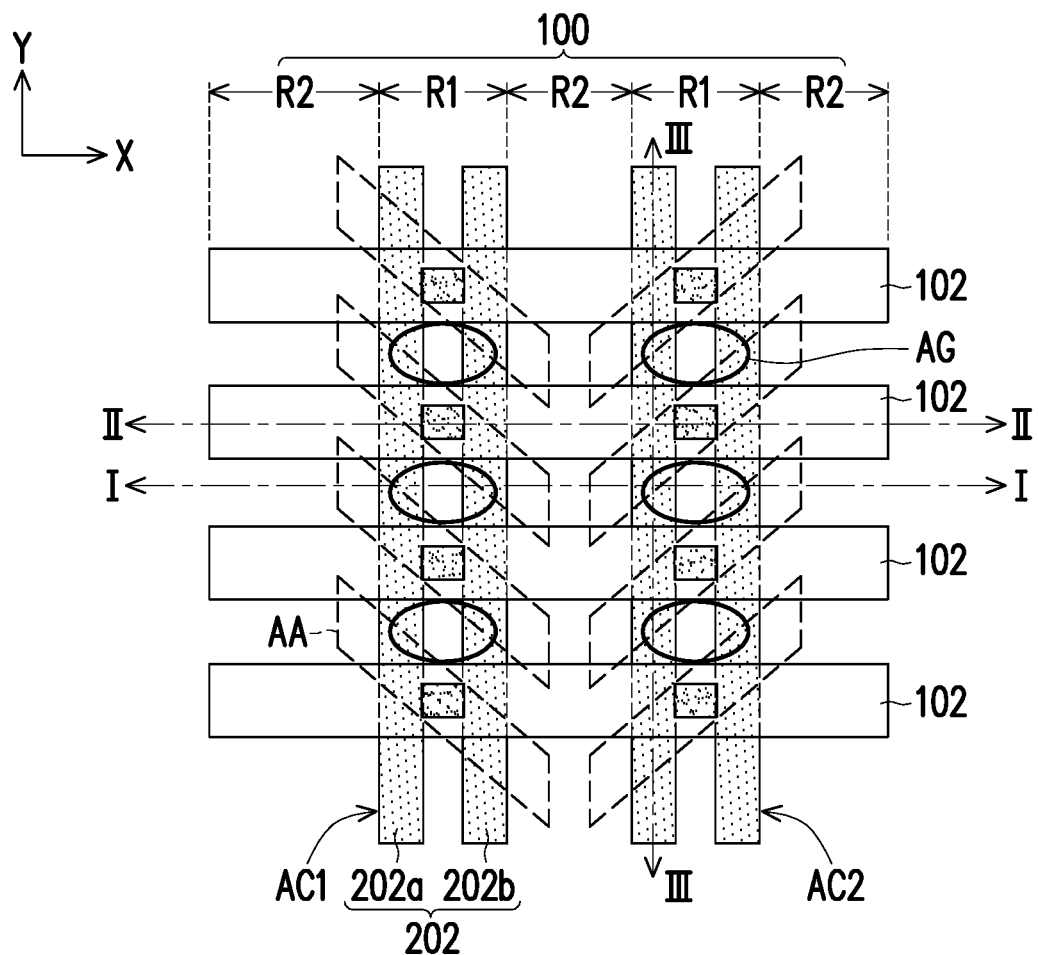
Figure 1K:
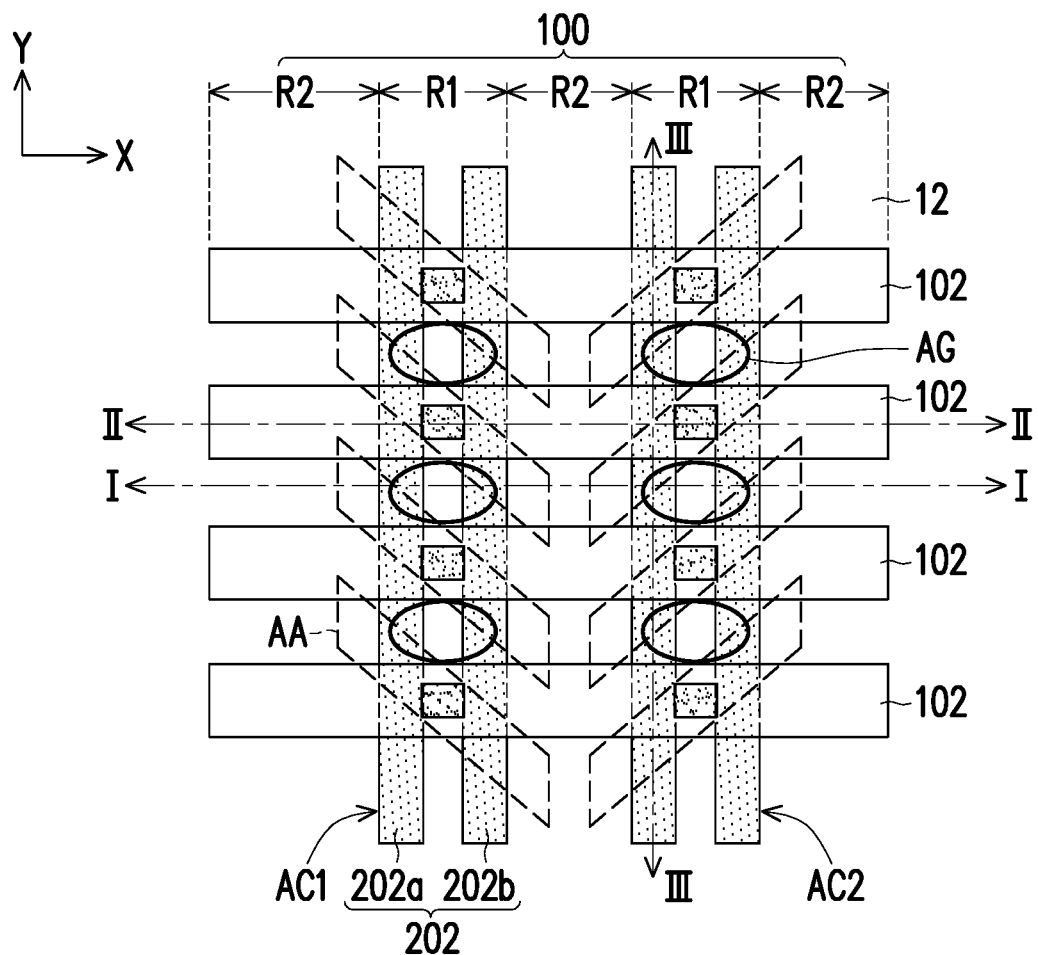
Figure 1L:
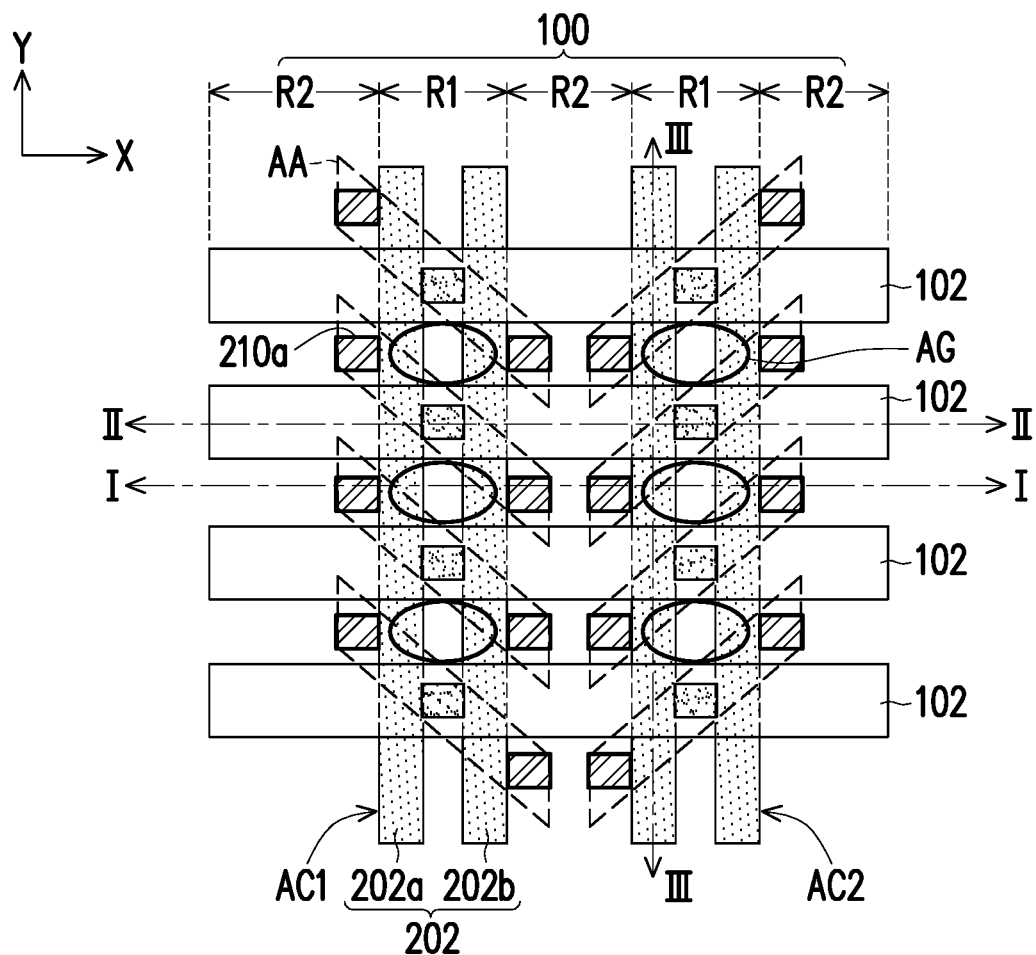
Figure 1M:
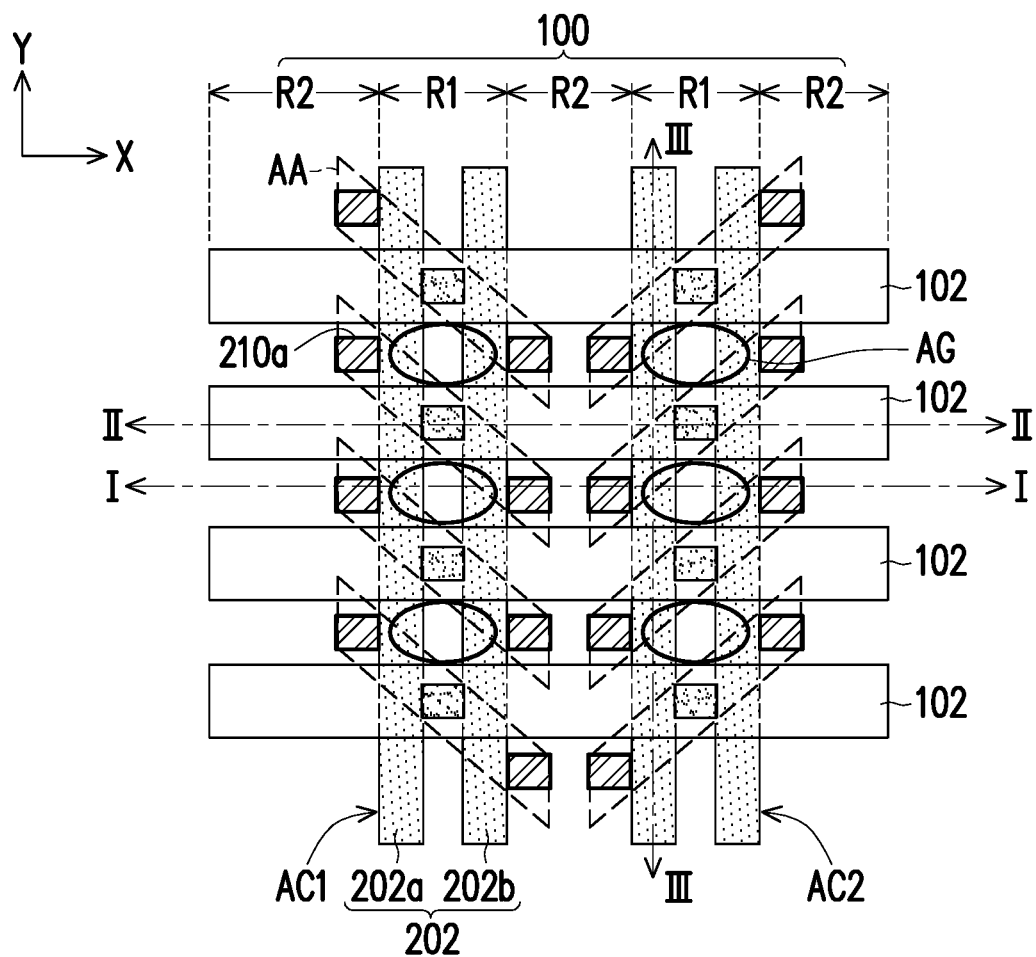
Figure 1N:
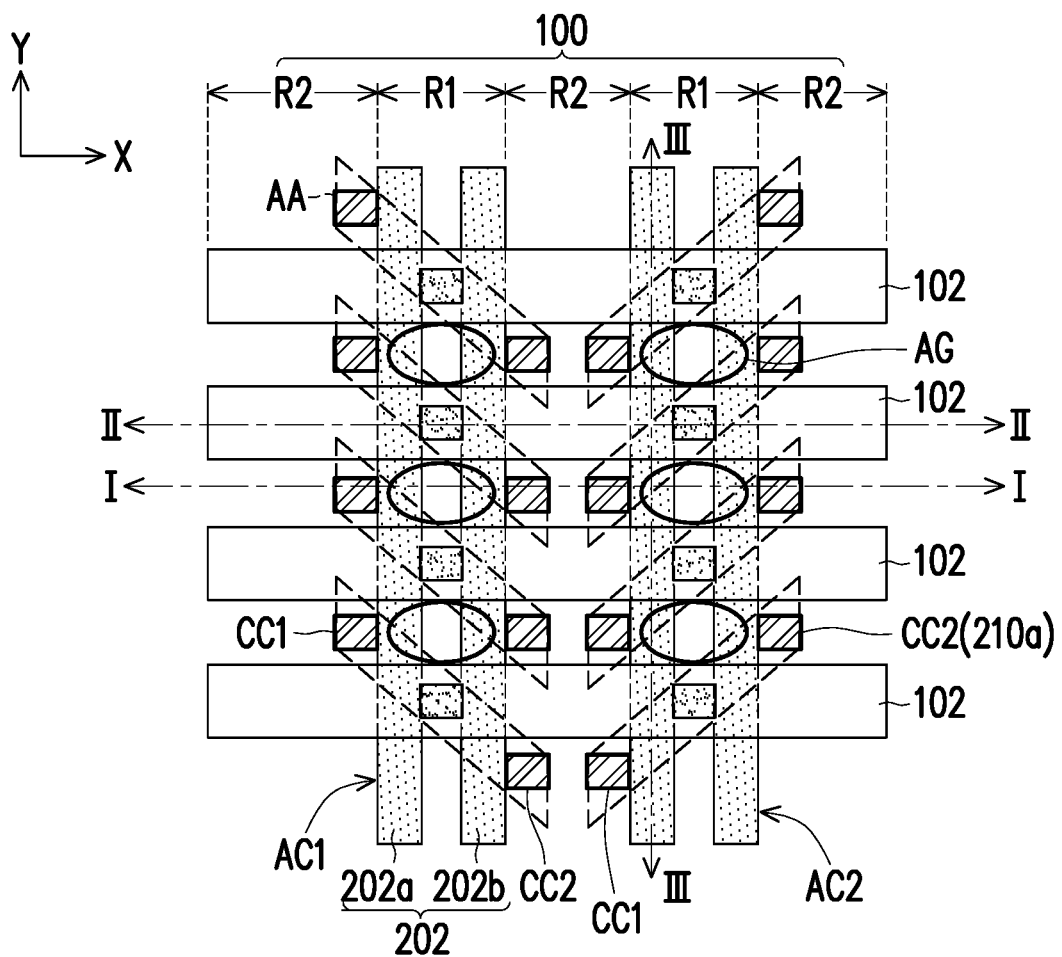
Figure 2A:
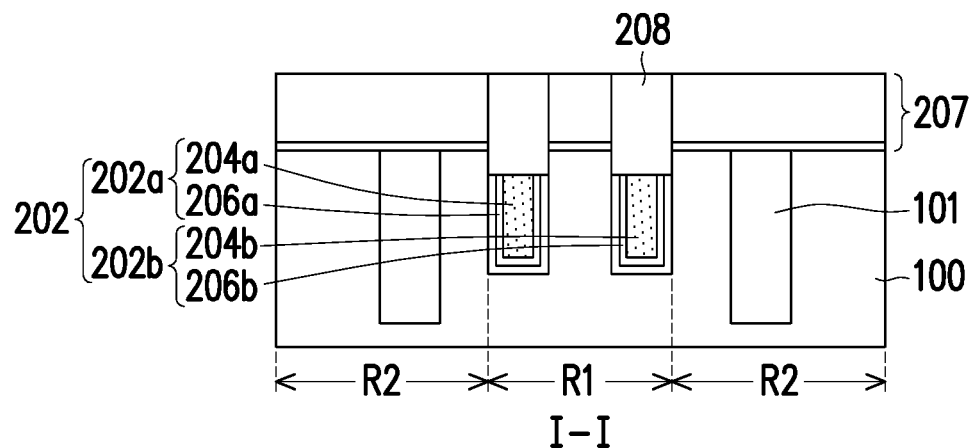
FIG. 2A to FIG. 2N are schematic cross-sectional views along line I-I depicted in FIG. 1A to FIG. 1N, respectively.
Figure 2B:
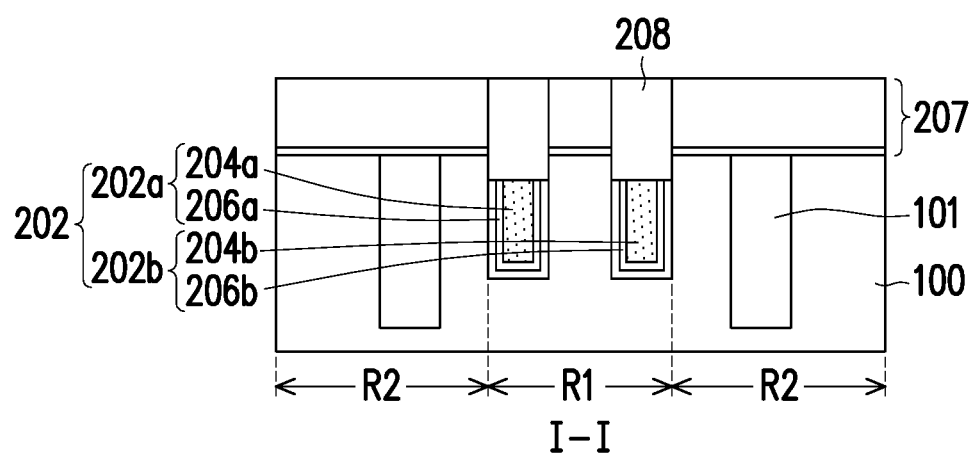
Figure 2C:
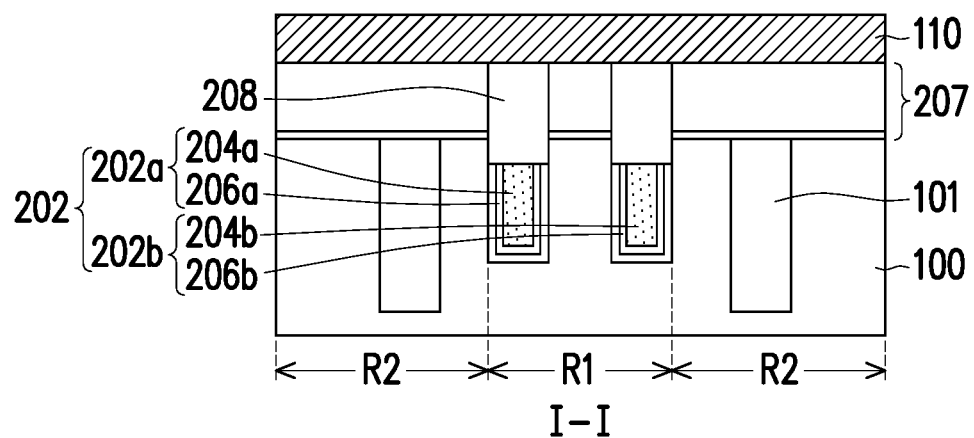
Figure 2D:
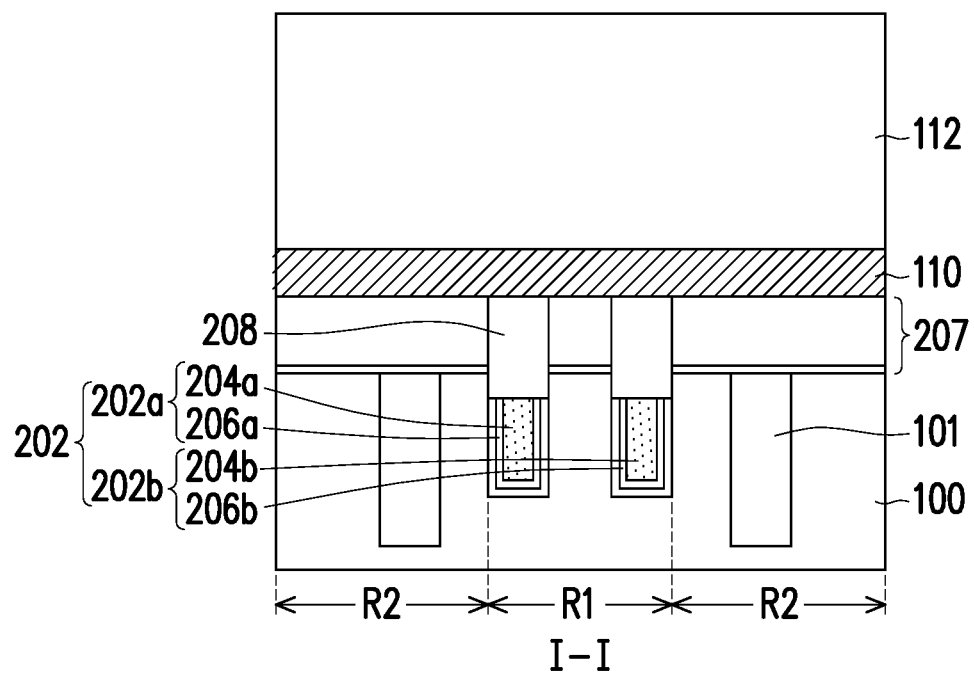
Figure 2E:
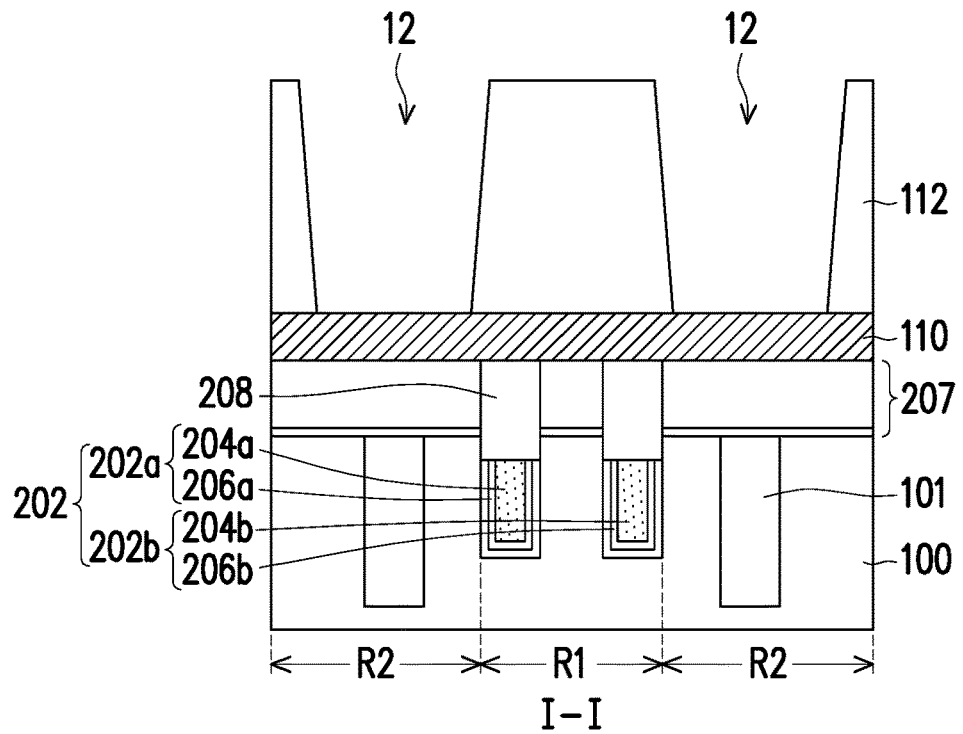
Figure 2N:
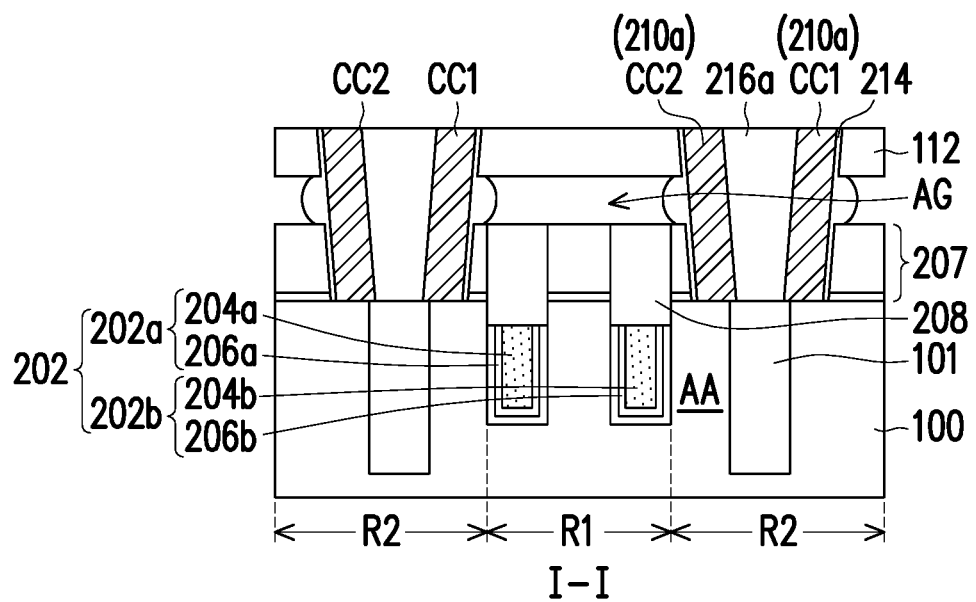
Figure 3A:
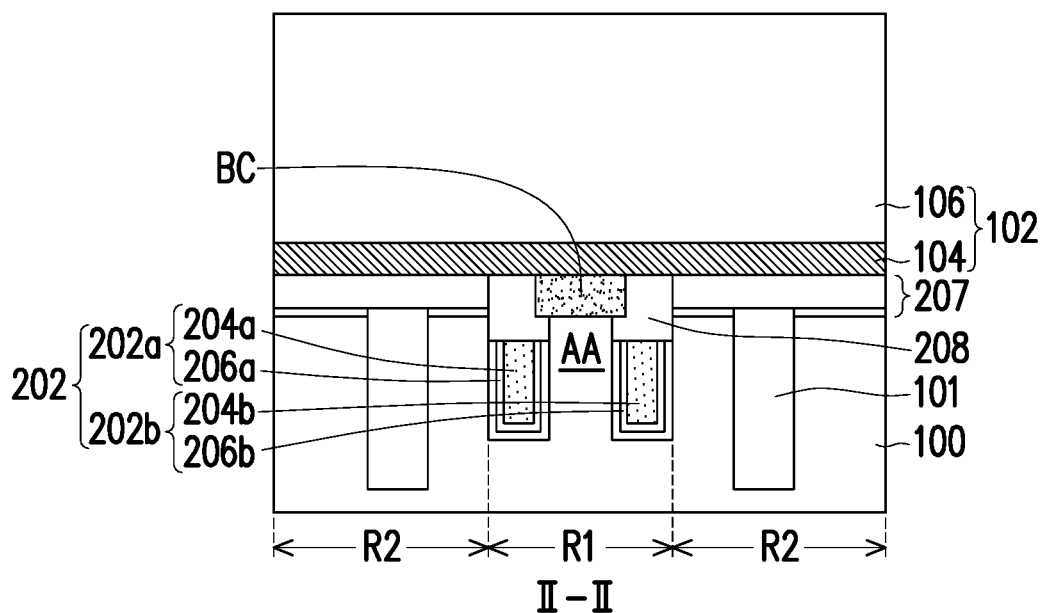
FIG. 3A to FIG. 3N are schematic cross-sectional views along line II-II depicted in FIG. 1A to FIG. 1N, respectively.
Figure 3B:
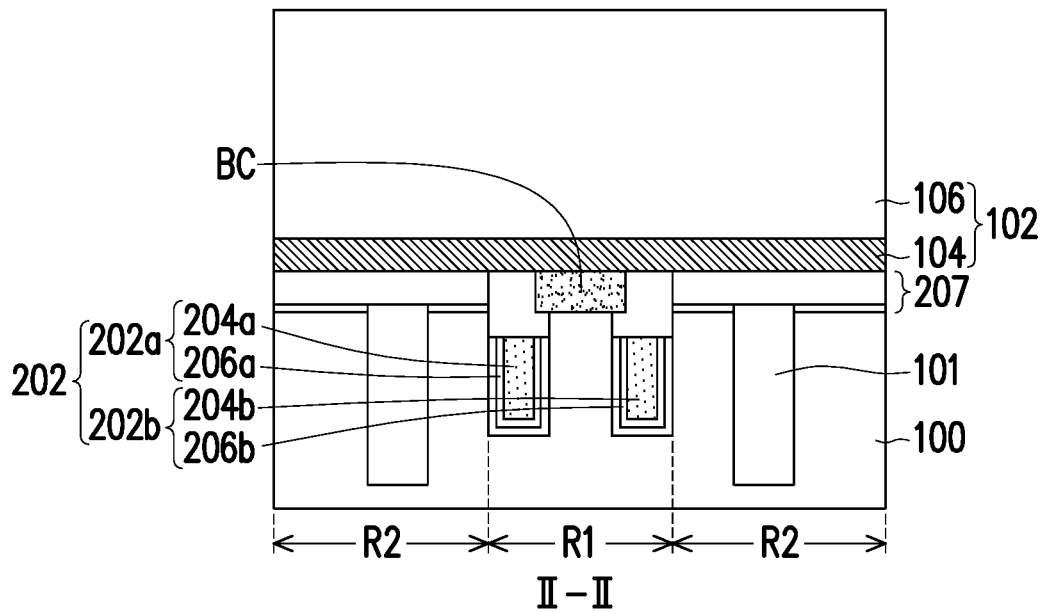
Figure 3C:
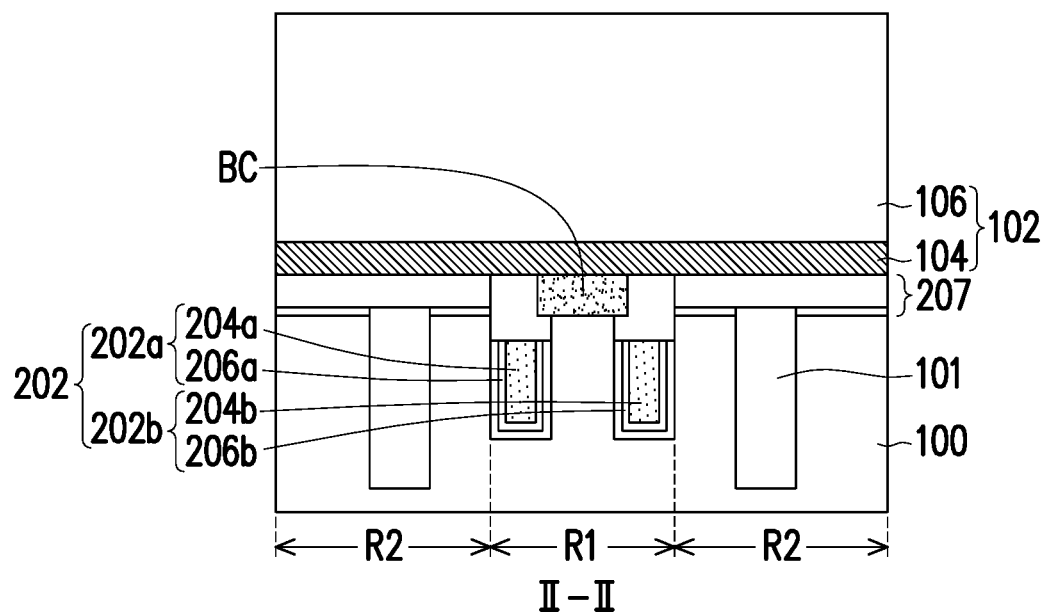
Figure 3D:
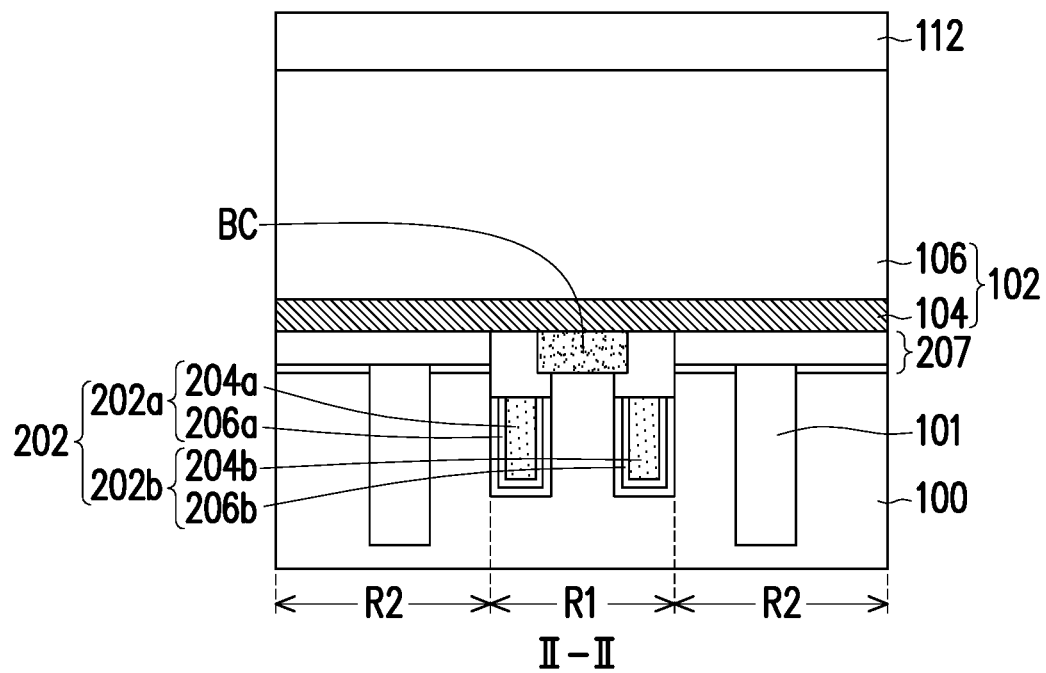
Figure 3E:
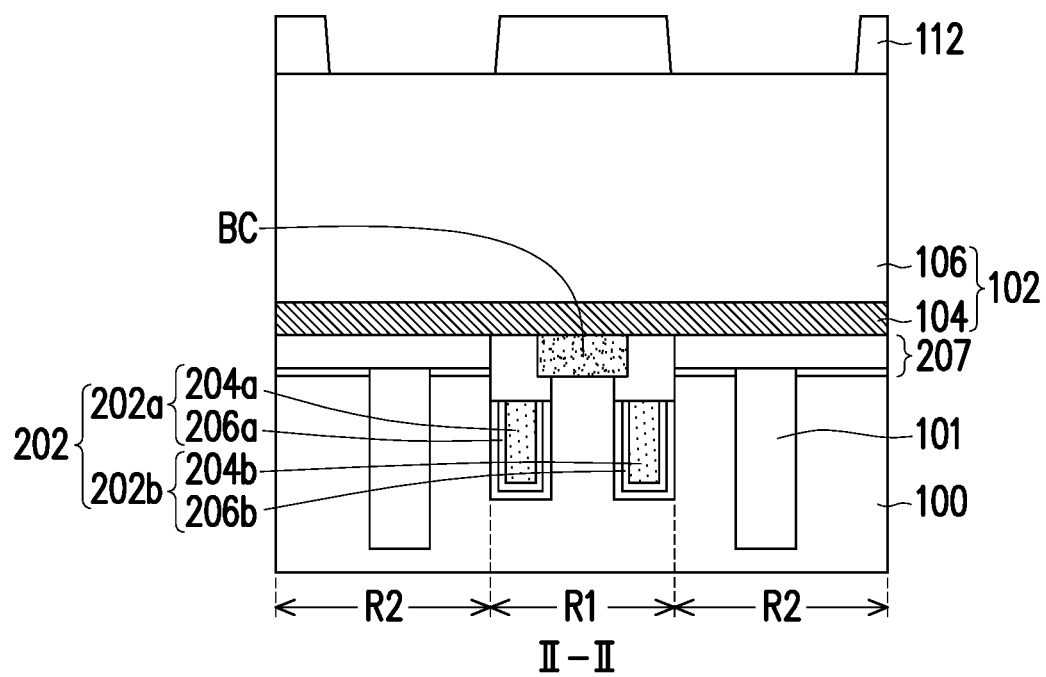
Figure 3F:
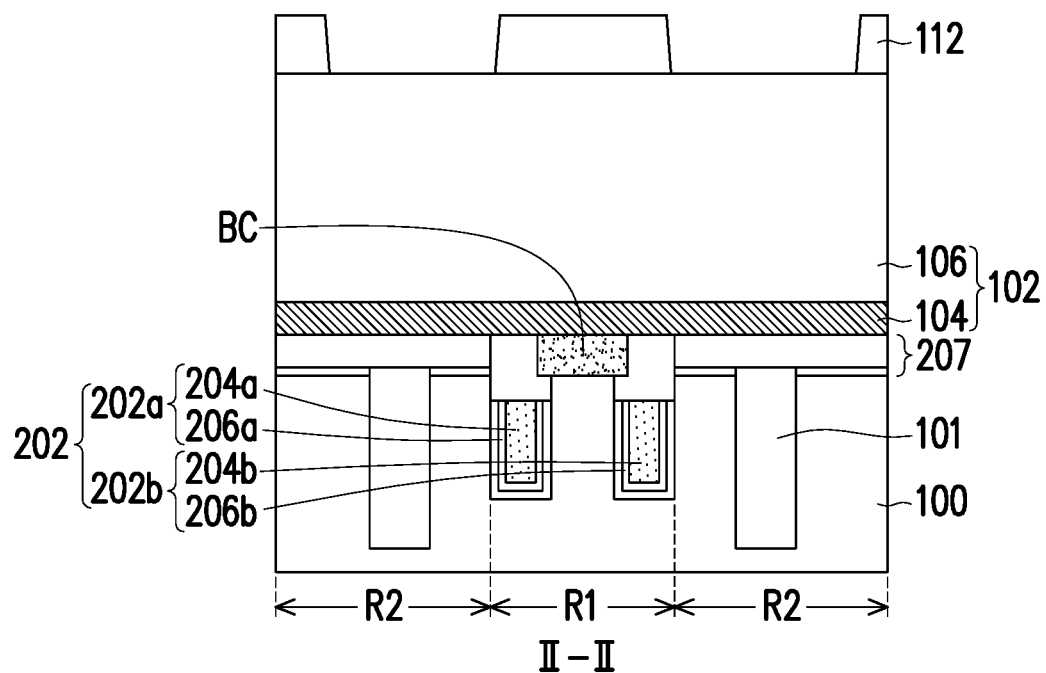
Figure 3G:
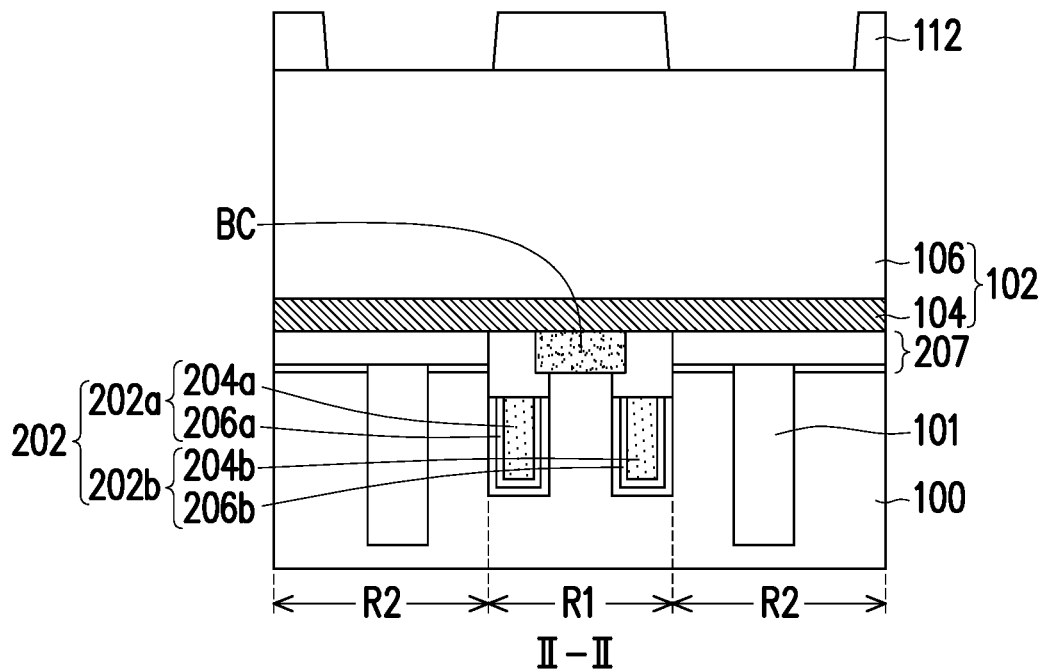
Figure 3H:
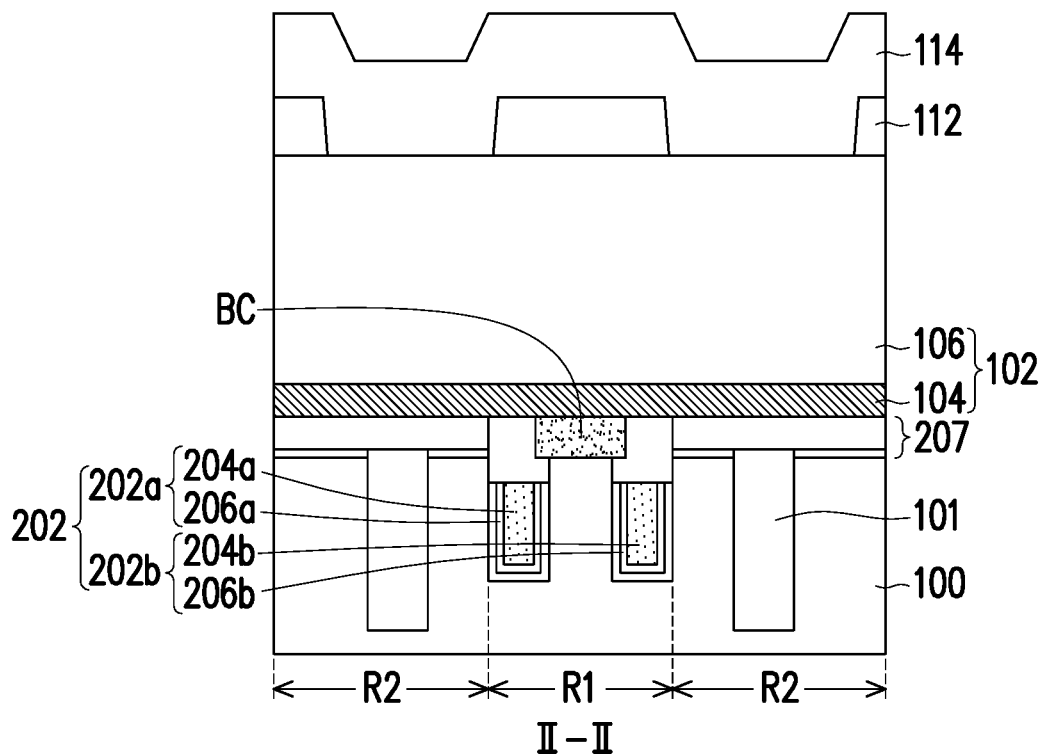
Figure 3I:
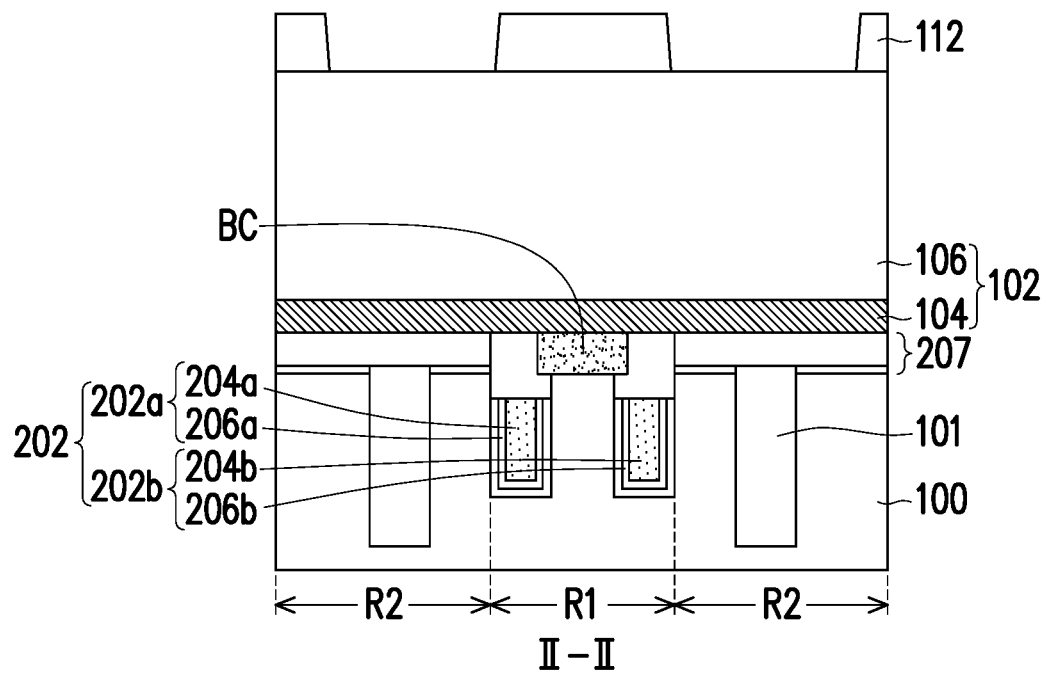
Figure 3J:
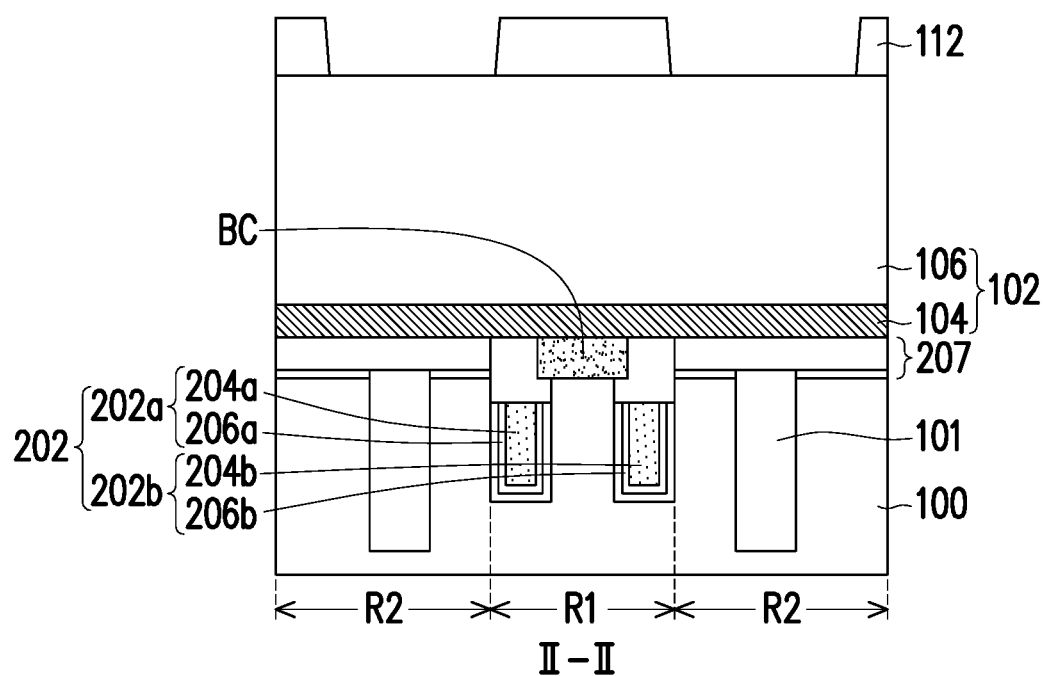
Figure 3K:
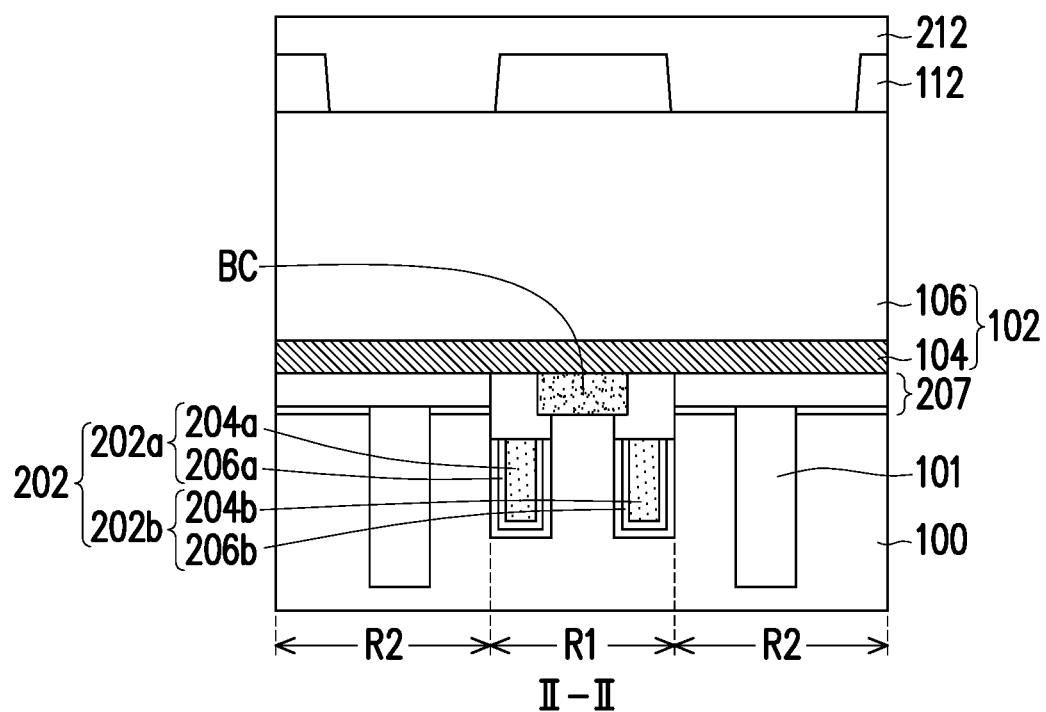
Figure 3L:
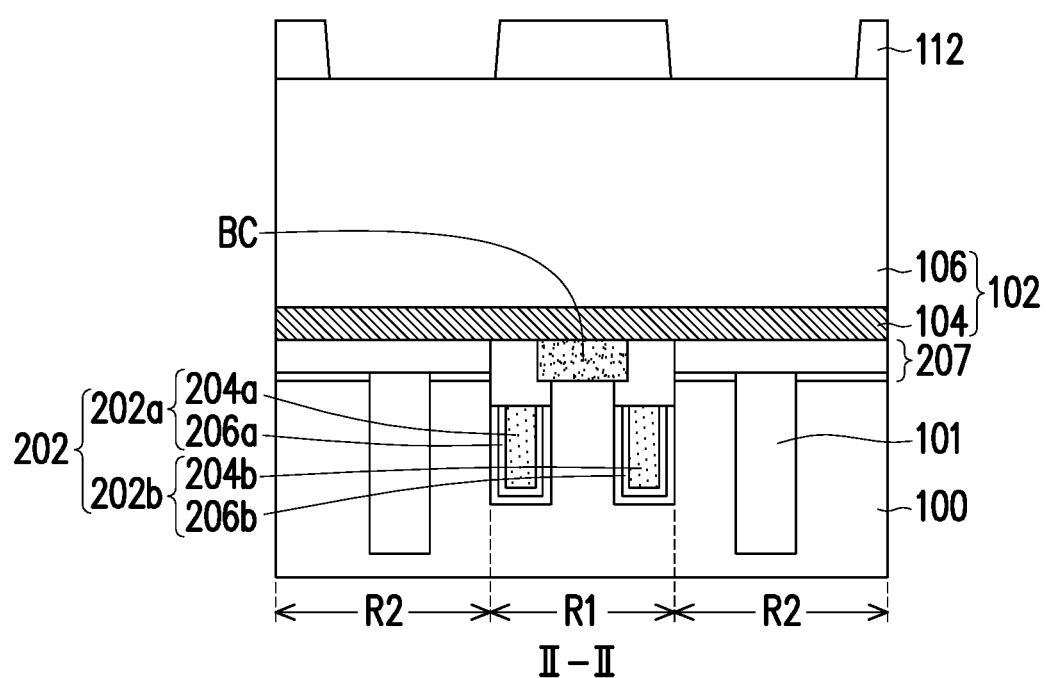
Figure 3M:
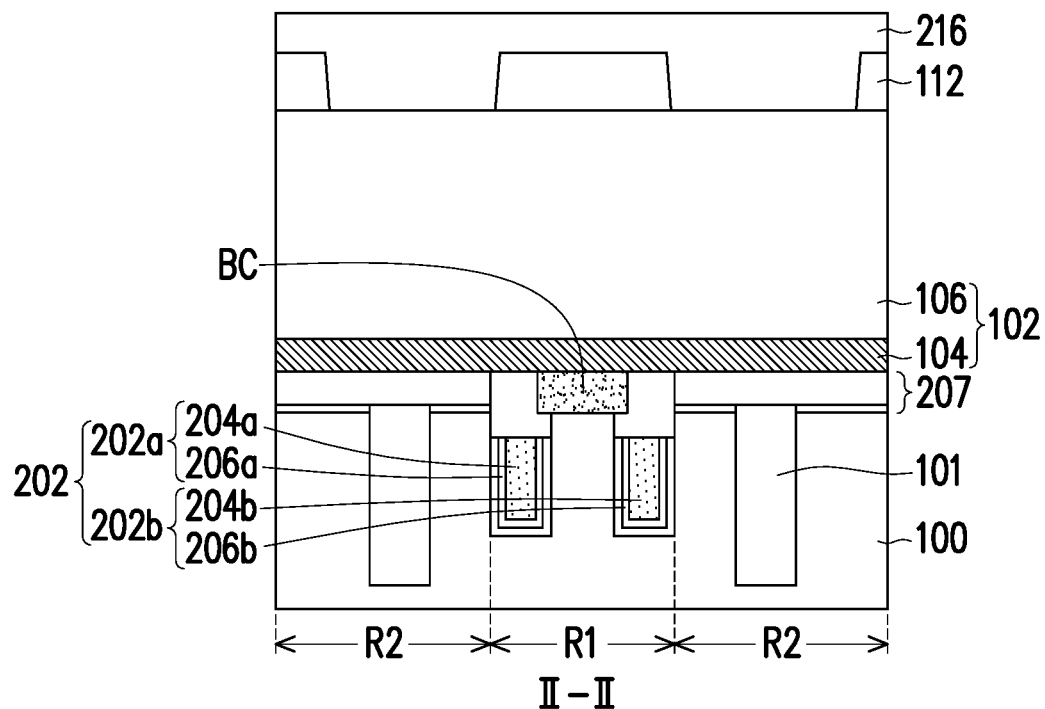
Figure 3N:
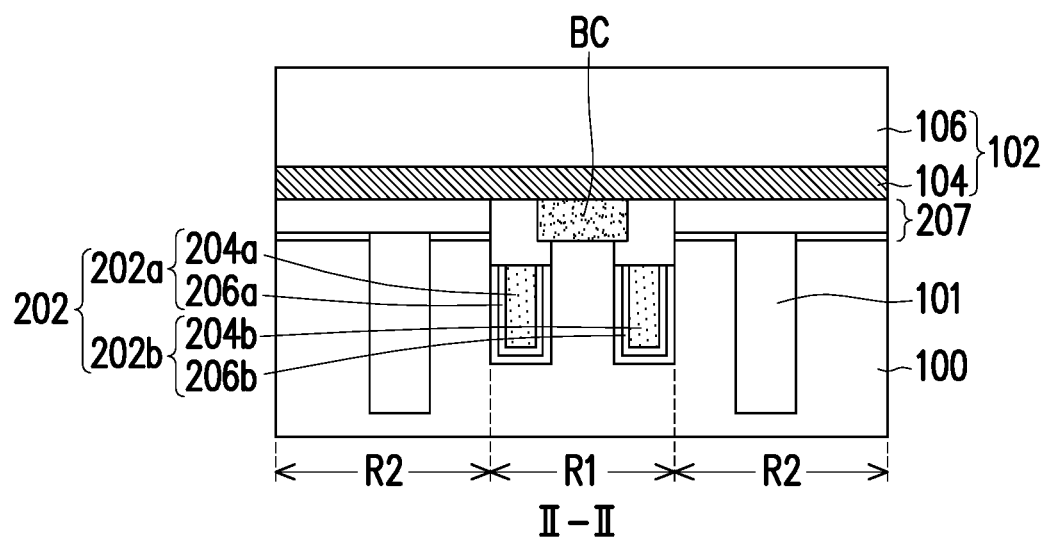
Figure 4A:
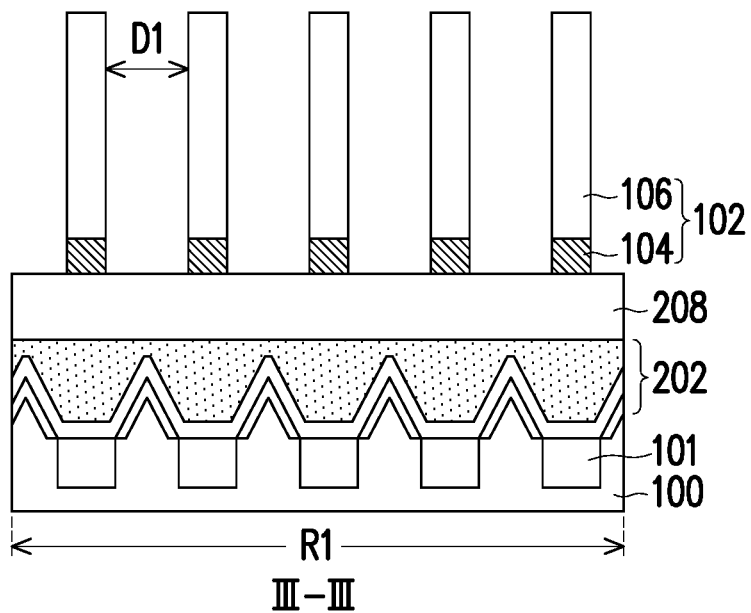
FIG. 4A to FIG. 4N are schematic cross-sectional views along line III-III depicted in FIG. 1A to FIG. 1N, respectively.

FIG. 1A to FIG. 1N are schematic top views illustrating a manufacturing process of a memory device according to an embodiment of the invention. FIG. 2A to FIG. 2N are schematic cross-sectional views along line I-I depicted in FIG. 1A to FIG. 1N, respectively. FIG. 3A to FIG. 3N are schematic cross-sectional views along line II-II depicted in FIG. 1A to FIG. 1N, respectively. FIG. 4A to FIG. 4N are schematic cross-sectional views along line III-III depicted in FIG. 1A to FIG. 1N, respectively.

Referring to FIG. 1A, FIG. 2A, FIG. 3A, and FIG. 4A, first, an initial structure is provided to include: a substrate 100, a plurality of isolation structures 101, a plurality of active areas AA, a plurality of bit-line structures 102, and a plurality of word-line sets 202.

Specifically, as shown in FIG. 1A, the substrate 100 includes a plurality of first regions R1 and a plurality of second regions R2. The first regions R1 and second regions R2 are alternately arranged along a X direction. The isolation structures 101 are disposed in the substrate 100 to define a plurality of active areas AA. In other words, there is an isolation structure 101 between two adjacent active areas AA. In one embodiment, one memory cell is formed on one active area AA, and the memory cells are separated by the isolation structures 101 to effectively reduce the interference issue between the memory cells. The active areas AA are configured as strips and arranged in an array. In this embodiment, the active areas AA are arranged into two active area columns AC1 and AC2, and the two adjacent active area columns AC1 and AC2 are in a mirror configuration.

The word-line sets 202 are configured in the substrate 100 of the first regions R1. The word-line sets 202 extend along a Y direction and are arranged to each other along the X direction. In one embodiment, the X direction and the Y direction are substantially perpendicular to each other. Each of the word-line sets 202 has two embedded word lines 202a, 202b. As shown in FIG. 2A, the embedded word line 202a includes a gate electrode 204a and a gate dielectric layer 206a. The gate dielectric layer 206a surrounds the gate electrode 204a to electrically isolate the gate electrode 204a from the substrate 100. In an embodiment, a material of the gate electrode 204a includes a conductive material, and the conductive material may be a metal material (e.g., tungsten), a barrier metal material (e.g., TiN), or a combination thereof. A material of the gate dielectric layer 206a may be, for example, silicon oxide, silicon nitride, silicon oxynitride, or a combination thereof. The gate dielectric layer 206a may be a single-layered structure, a bi-layered structure, or a multi-layered structure. Similarly, another embedded word line 202b also includes a gate electrode 204b and a gate dielectric layer 206b. The gate dielectric layer 206b surrounds the gate electrode 204b to electrically isolate the gate electrode 204b from the substrate 100. In addition, the initial structure further includes a silicon oxide layer 207 and a silicon nitride layer 208. In detail, the silicon nitride layer 208 is disposed on the embedded word lines 202a and 202b to seal the embedded word lines 202a and 202b. The silicon oxide layer 207 is disposed aside the silicon nitride layer 208 and covers a top surface of the substrate 100 and top surfaces of the isolation structures 101.

The bit-line structures 102 extend along the X direction and are arranged to each other along the Y direction. As shown in FIG. 1A, the bit-line structures 102 traverse across the first regions R1 and second regions R2. As shown in FIG. 4A, the bit-line structures 102 are disposed on substrate 100. Each of the bit-line structures 102 includes a conductive layer 104 and a cap layer 106 on the conductive layer 104. In an embodiment, a material of the conductive layer 104 may be a metal material, such as tungsten. A material of the cap layer 106 may be silicon nitride. In this embodiment, the conductive layer 104 may be regarded as a bit line. As shown in FIG. 3A, the bit line 104 is electrically isolated from the substrate 100 by the silicon oxide layer 207, and is electrically isolated from the word-line set 202 by the silicon nitride layer 208. In addition, the bit-line structure 102 may be electrically connected to the active area AA (e.g., the source/drain doped region in the substrate 100) by a bit-line contact BC. As shown in FIG. 1A, the bit-line contacts BC are located at the overlaps between the active areas AA and the bit-line structures 102, and are located between two embedded word lines 202a and 202b. In an embodiment, a material of the bit-line contacts BC may be a metal material (such as tungsten), a semiconductor material (such as epitaxial silicon or SiGe), or a combination thereof.

Figure 4B:
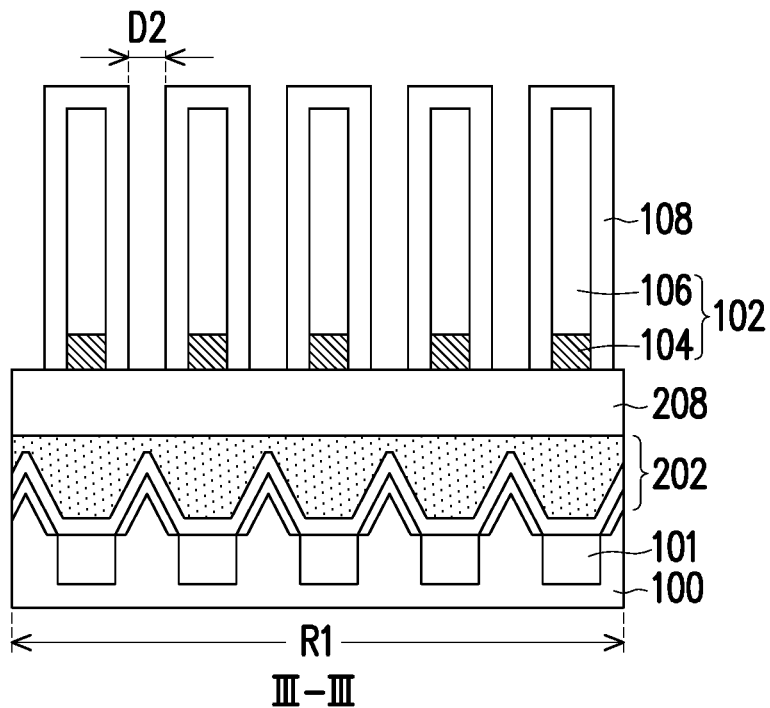

Referring to FIG. 1B, FIG. 2B, FIG. 3B and FIG. 4B, after defining the bit-line structures 102, spacers 108 are formed on both sides of the bit-line structures 102, so that a distance D1 (FIG. 4A) between adjacent bit-line structures 102 is reduced to a distance D2 (FIG. 4B). In one embodiment, a material of the spacers 108 includes a dielectric material, such as silicon oxide, silicon nitride, silicon oxynitride, or a combination thereof. Although only the single-layered spacer 108 is illustrated in FIG. 4B, the present invention is not limited thereto. In other embodiments, the spacer 108 may be a bi-layer structure or a multi-layered structure to adjust the distance D2 between adjacent bit-line structures 102.

Figure 4C:
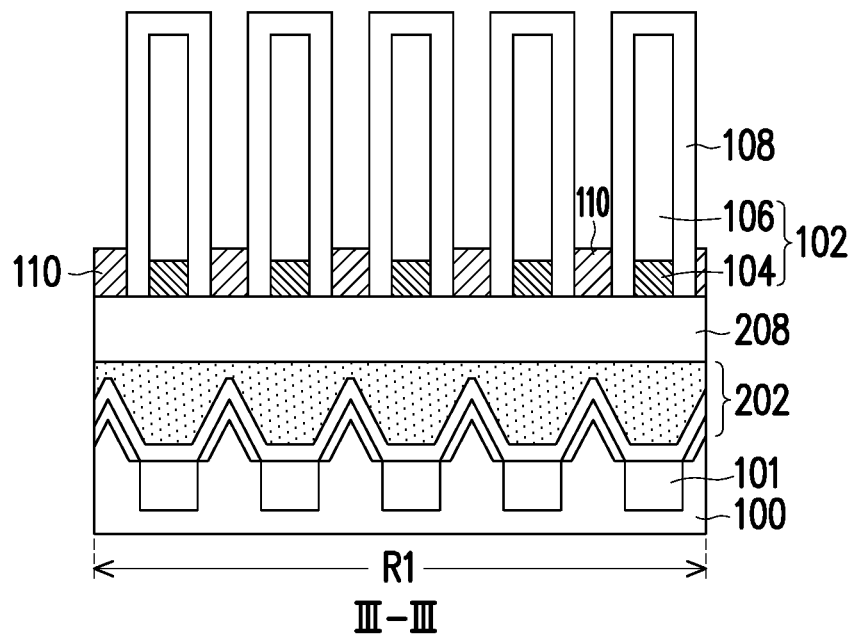

Referring to FIG. 1C, FIG. 2C, FIG. 3C, and FIG. 4C, a sacrificial layer 110 is formed on the substrate 100. As shown in FIG. 4C, the sacrificial layer 110 fills in the gaps between the bit-line structures 102. The top surface of the sacrificial layer 110 may be lower than the top surfaces of the bit-line structures 102, and the top surface of the sacrificial layer 110 may be higher than the top surfaces of the conductive layers 104. In one embodiment, a material of the sacrificial layer 110 includes polysilicon. However, the present invention is not limited thereto. In other embodiments, as long as a material has a high etching selectivity with respect to silicon oxide and silicon nitride and may be removed by the wet etching, the material is a candidate material of the sacrificial layer 110 of the present invention. In addition, for the sake of clarity, the sacrificial layer 110 is omitted from the top view.

Figure 4D:
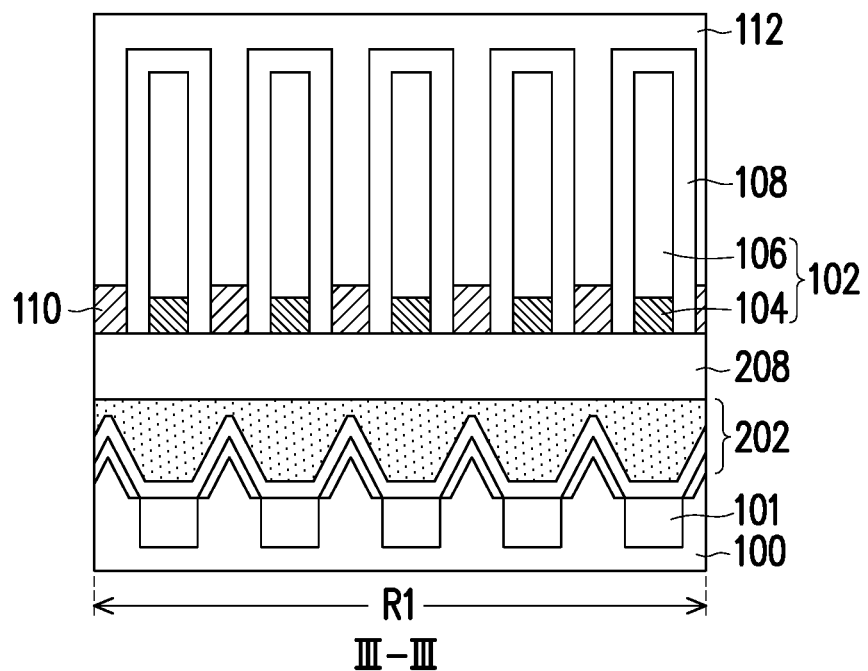
Figure 4E:
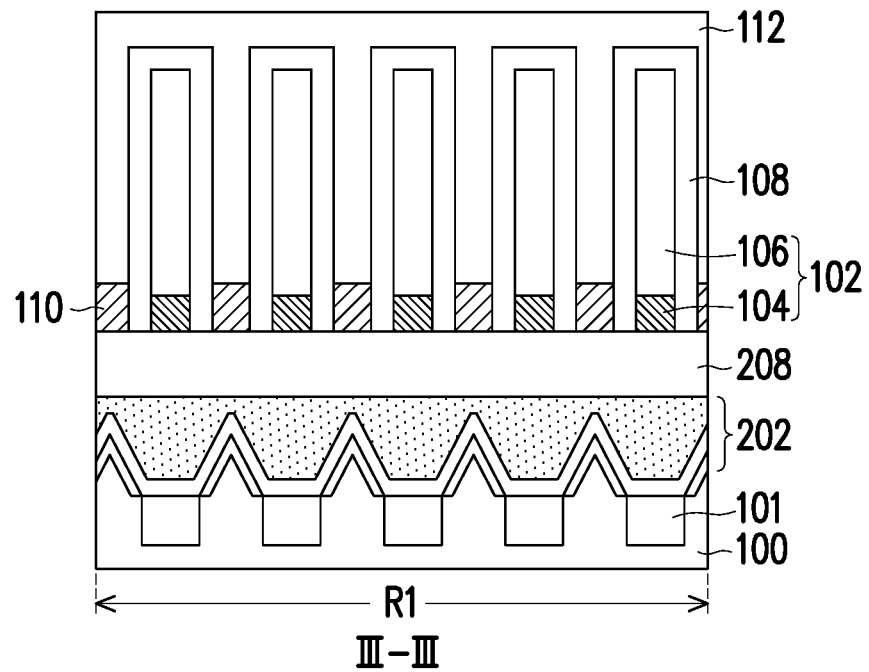
Figure 4F:
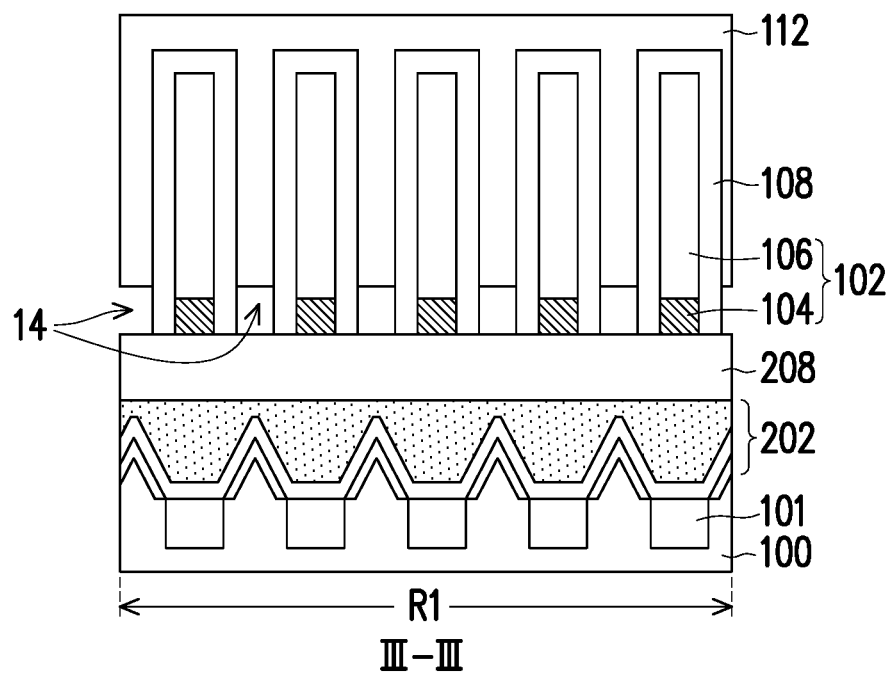
Figure 4G:
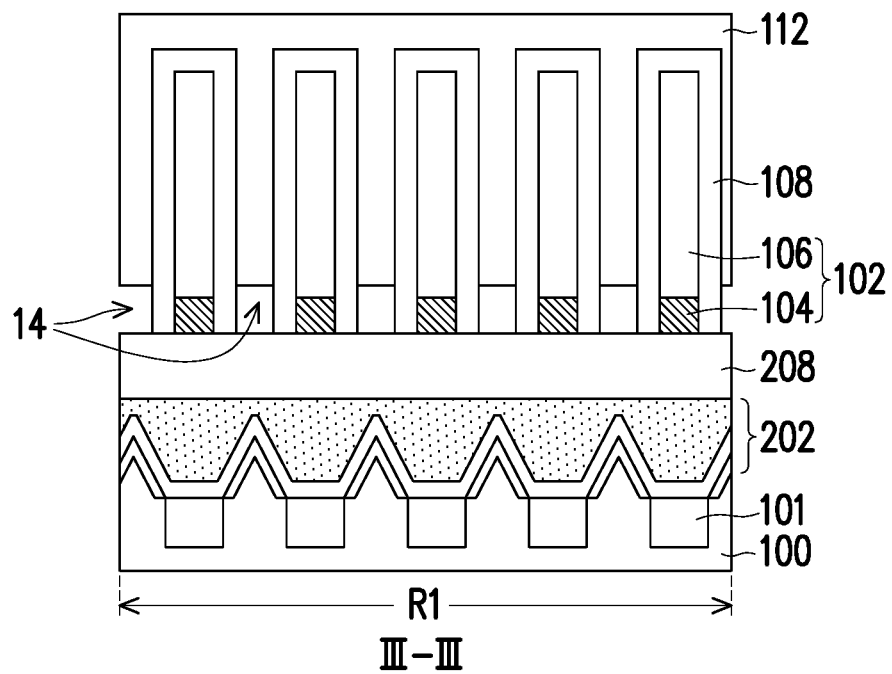
Figure 4H:
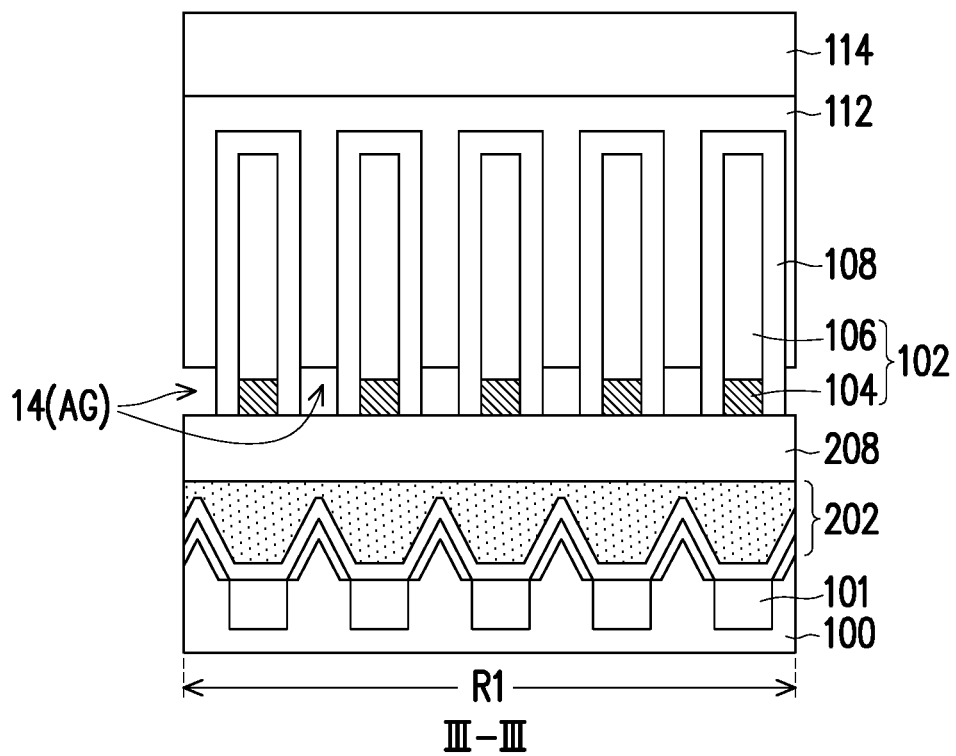
Figure 4I:
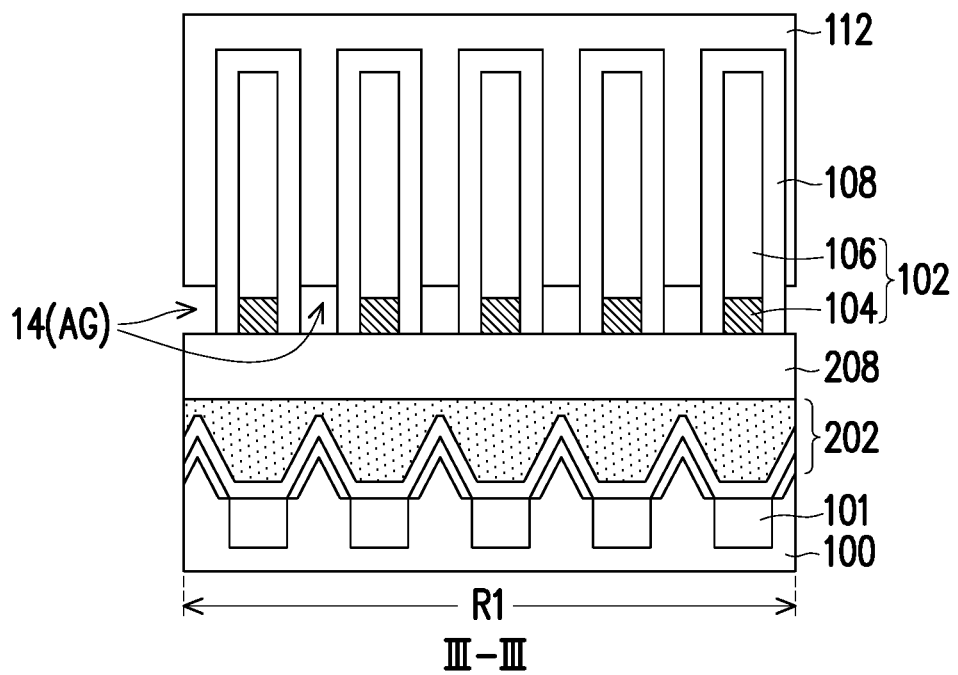
Figure 4J:
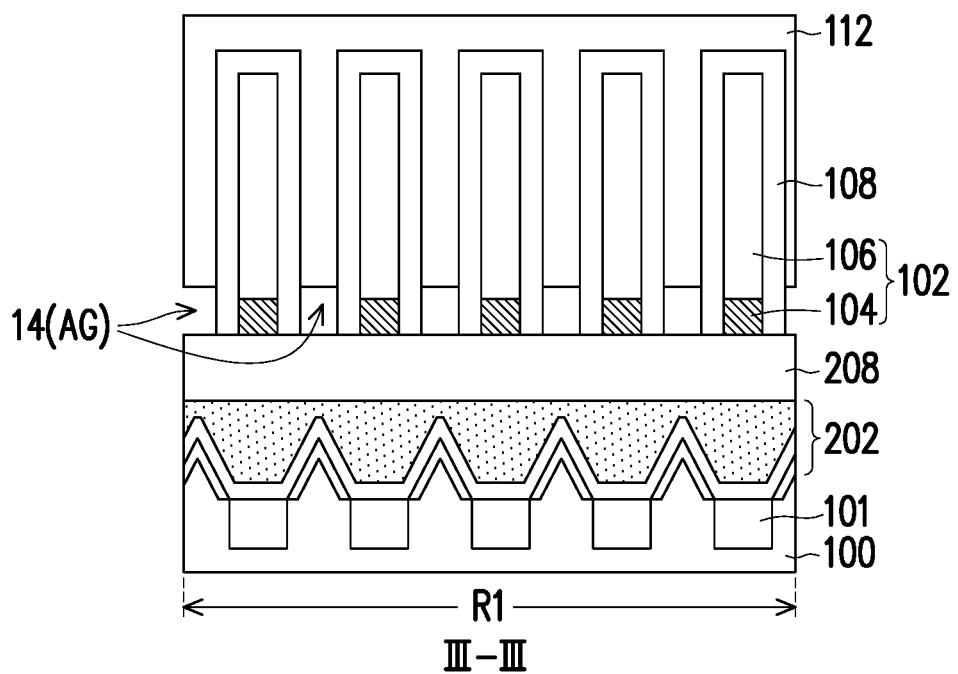
Figure 4K:
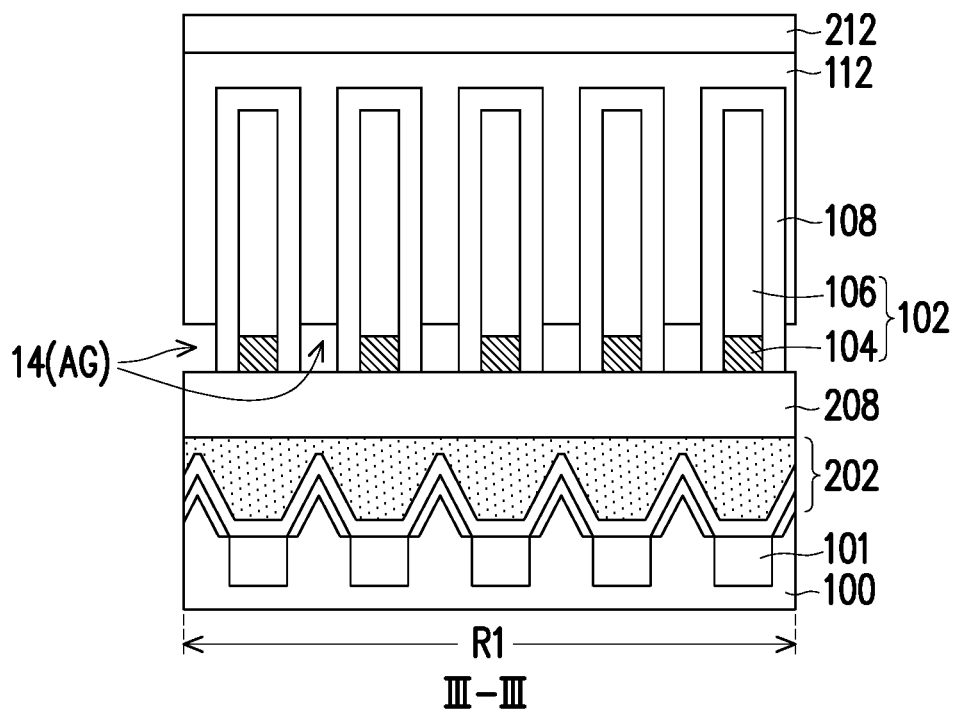
Figure 4L:
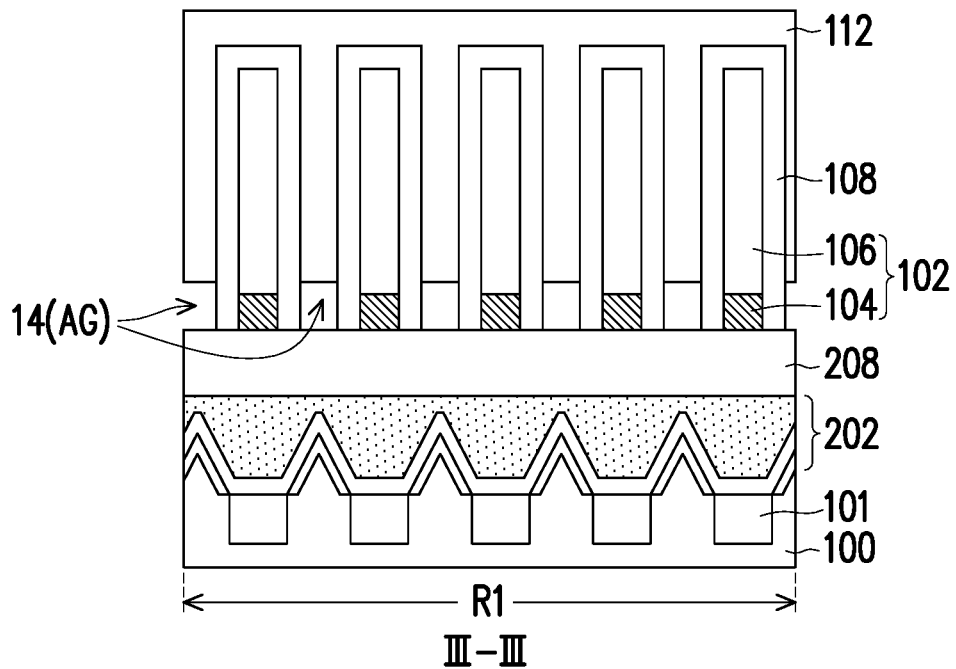
Figure 4M:
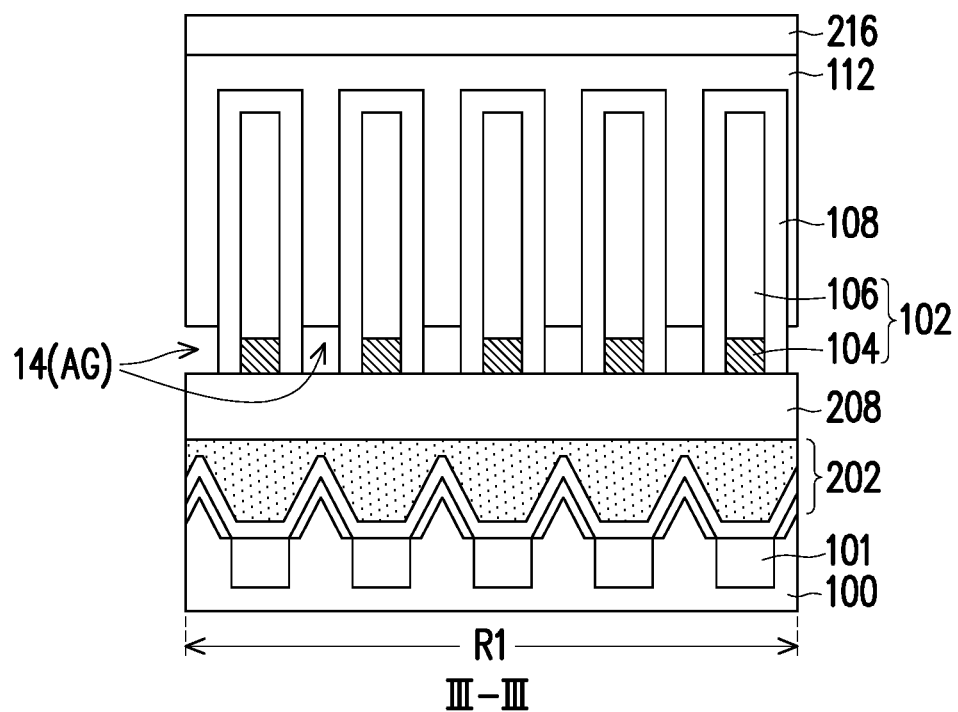
Figure 4N:
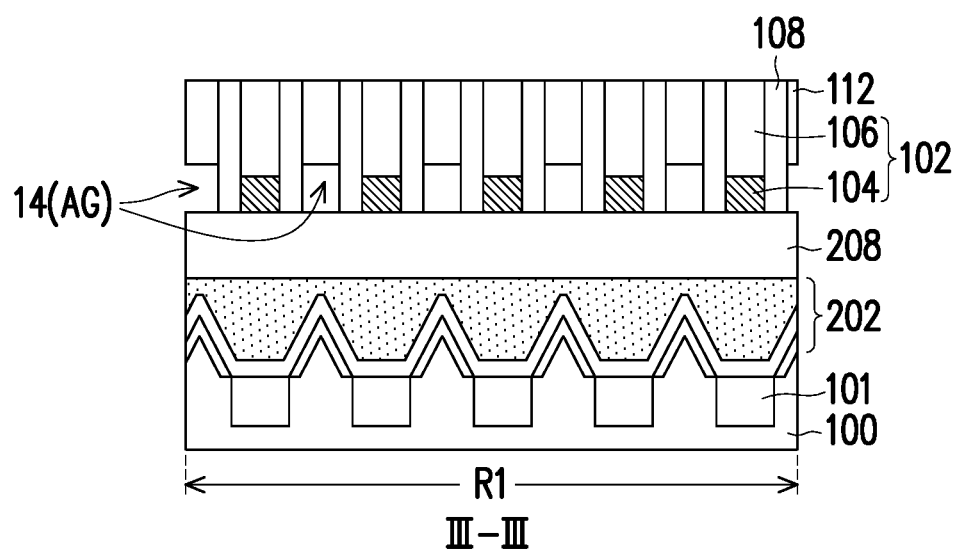

Referring to FIG. 1D, FIG. 2D, FIG. 3D, and FIG. 4D, a dielectric layer 112 (also referred to as a first dielectric layer) is formed on the sacrificial layer 110. As shown in FIG. 4D, the dielectric layer 112 fills in the gaps between the bit-line structures 102, and extends to cover the top surfaces of the bit-line structures 102 and the spacers 108. In an embodiment, a material of the dielectric layer 112 includes an insulating material, such as silicon oxide, silicon nitride, silicon oxynitride, or a combination thereof.

Referring to FIG. 1E, FIG. 2E, FIG. 3E, and FIG. 4E, a plurality of trenches 12 are formed in the dielectric layer 112 of the second regions R2. As shown in FIG. 1E, the trenches 12 extend along the Y direction and expose the top surface of the sacrificial layer 110 in the second regions R2. In one embodiment, the trenches 12 are formed by forming a photoresist pattern on the dielectric layer 112 of the second regions R2; removing a portion of the dielectric layer 112 by using the photoresist pattern as a mask; and removing the photoresist pattern.

Figure 2F:
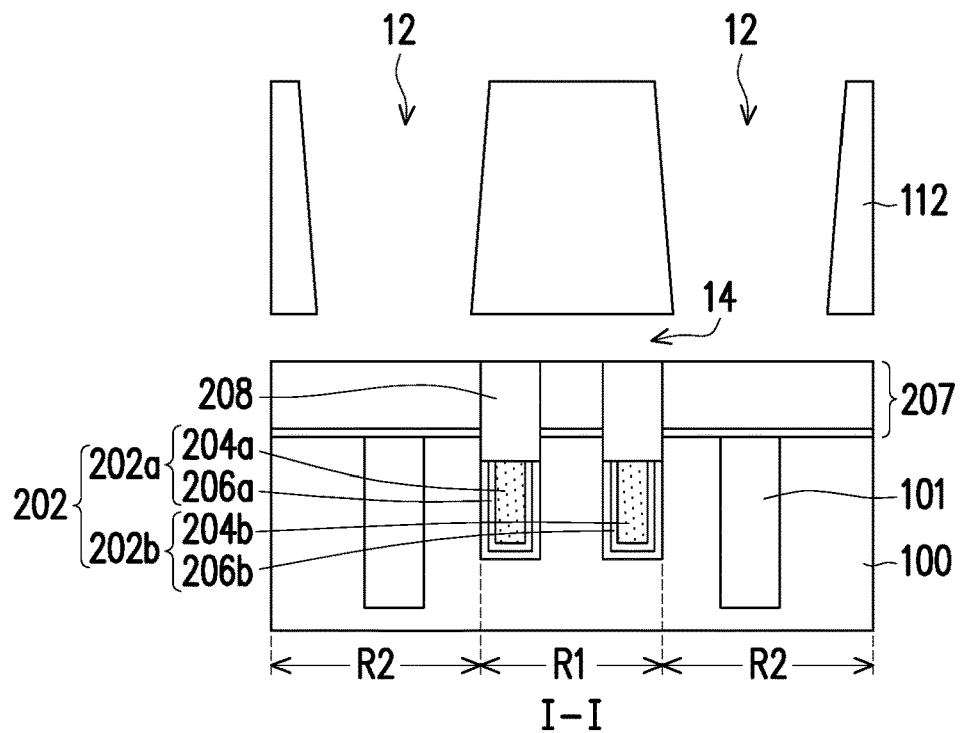

Referring to FIG. 1F, FIG. 2F, FIG. 3F, and FIG. 4F, a first etching process is performed to remove the sacrificial layer 110. In this case, as shown in FIG. 1F and FIG. 2F, the sacrificial layer 110 in the first regions R1 is hollowed out, so as to form channels 14 between adjacent bit-line structures 102. From another perspective, the channels 14 are located between the word-line sets 202 and the dielectric layer 112 in the first regions R1. In one embodiment, the first etching process includes a wet etching process. Specifically, the etching solution used in the first etching process may contact the sacrificial layer 110 along the trenches 12 and hollow out the sacrificial layer 110 under the dielectric layer 112. In this embodiment, the sacrificial layer 110 and the dielectric layer 112 have a high etching selectivity. In other words, the etching solution used in the first etching process may completely remove the sacrificial layer 110 without removing the dielectric layer 112 or remove a small amount of the dielectric layer 112.

Figure 2G:
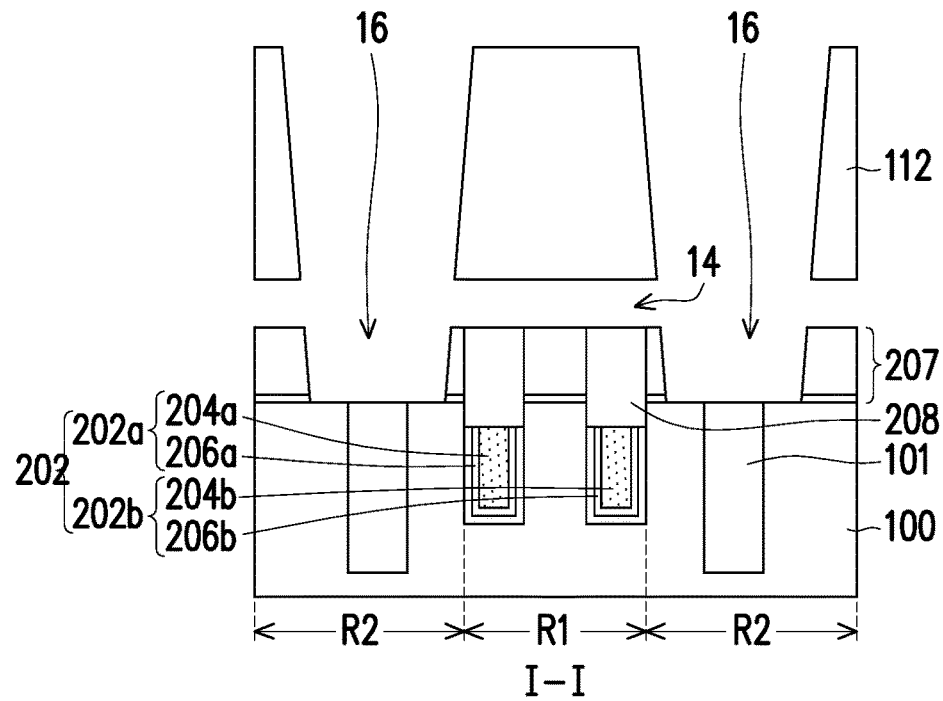

Referring to FIG. 1G, FIG. 2G, FIG. 3G, and FIG. 4G, by using the dielectric layer 112 as a mask, the silicon oxide layer 207 under the trenches 12 is removed to expose the top surface of the substrate 100 and the top surfaces of the isolation structures 101. In this case, as shown in FIG. 2G, the trenches 12 extend downward to form trenches 16 with a deeper depth.

Figure 2H:
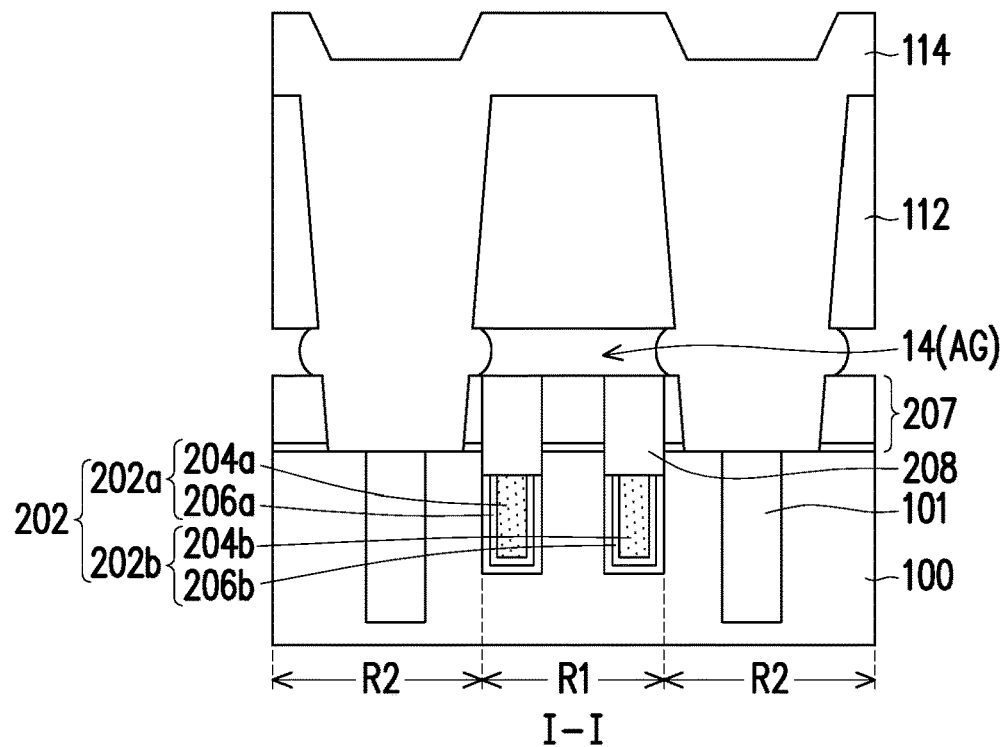

Referring to FIG. 1H, FIG. 2H, FIG. 3H, and FIG. 4H, after forming the trenches 16, a dielectric layer 114 (also referred to as a second dielectric layer) is formed on the substrate 100. Specifically, as shown in FIG. 2H, the dielectric layer 114 fills in the trenches 16 and extends to cover the top surface of the dielectric layer 112. In addition, a portion of the dielectric layer 114 further extends into the channels 14 under the dielectric layer 112 to seal the channels 14, thereby forming air gaps AG between adjacent bit-line structures 102, as shown in FIG. 1H.

However, the present invention is not limited thereto, in other embodiments, the dielectric layer 114 may not extend into the channels 14 (or air gaps AG). In one embodiment, a material of the dielectric layer 114 includes silicon oxide, silicon nitride, silicon oxynitride, or a combination thereof.

Figure 2I:
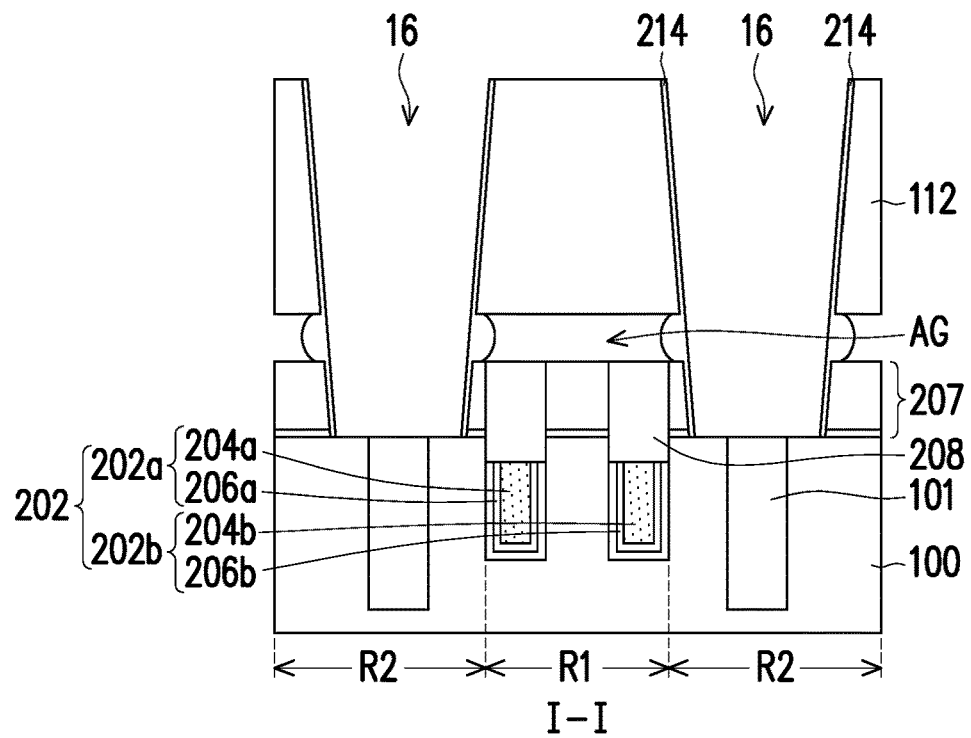
Figure 2J:
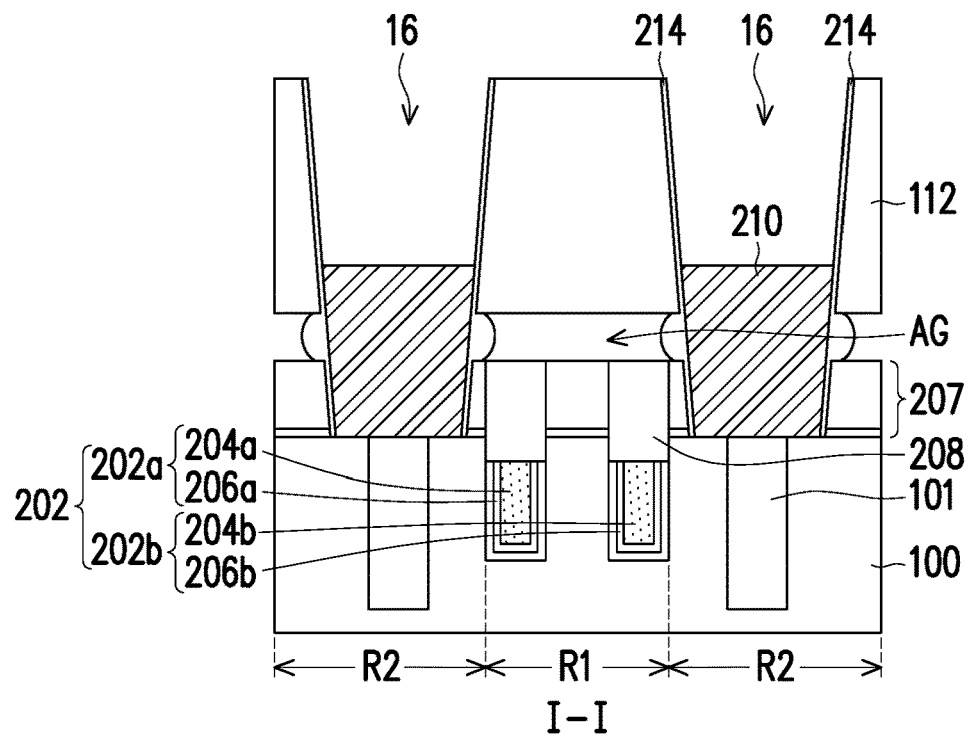

Referring to FIG. 1I, FIG. 2I, FIG. 3I, and FIG. 4I, a second etching process is performed to remove a portion of the dielectric layer 114, so as to expose the top surface of the substrate 100 in the second regions R2. In this case, as shown in FIG. 2I, the remaining dielectric layer 214 covers the sidewalls of the trenches 16 in the form of spacers. Accordingly, the dielectric layer 214 is referred to as the spacers 214 hereinafter. At this time, the spacers 214 still seal the both sides of the air gaps AG. In one embodiment, the second etching process includes a dry etching process or an anisotropic etching process, such as a reactive ion etching (RIE) process.

Referring to FIG. 1J, FIG. 2J, FIG. 3J, and FIG. 4J, a conductive layer 210 is formed in the trenches 16. In one embodiment, the conductive layer 210 is formed by forming a conductive material in the trenches 16; and etching back the conductive material so that the top surface of the conductive layer 210 is lower than the top surface of the dielectric layer 112. In this embodiment, the conductive material includes polysilicon. In addition, for the sake of clarity, the conductive layer 210 is omitted in the top view.

Referring to FIG. 1K, FIG. 2K, FIG. 3K, and FIG. 4K, a dielectric layer 212 (also referred to as a third dielectric layer) is formed on the substrate 100. The dielectric layer 212 is conformally formed on the conductive layer 210 and the dielectric layer 112. Since there is a height difference between the top surface of the conductive layer 210 and the top surface of the dielectric layer 112, a top surface of the dielectric layer 212 may be a continuous uneven structure, for example. The dielectric layer 212 located on the dielectric layer 112 is a convex portion; and the dielectric layer 212 located on the conductive layer 210 is a concave portion.

Figure 2K:
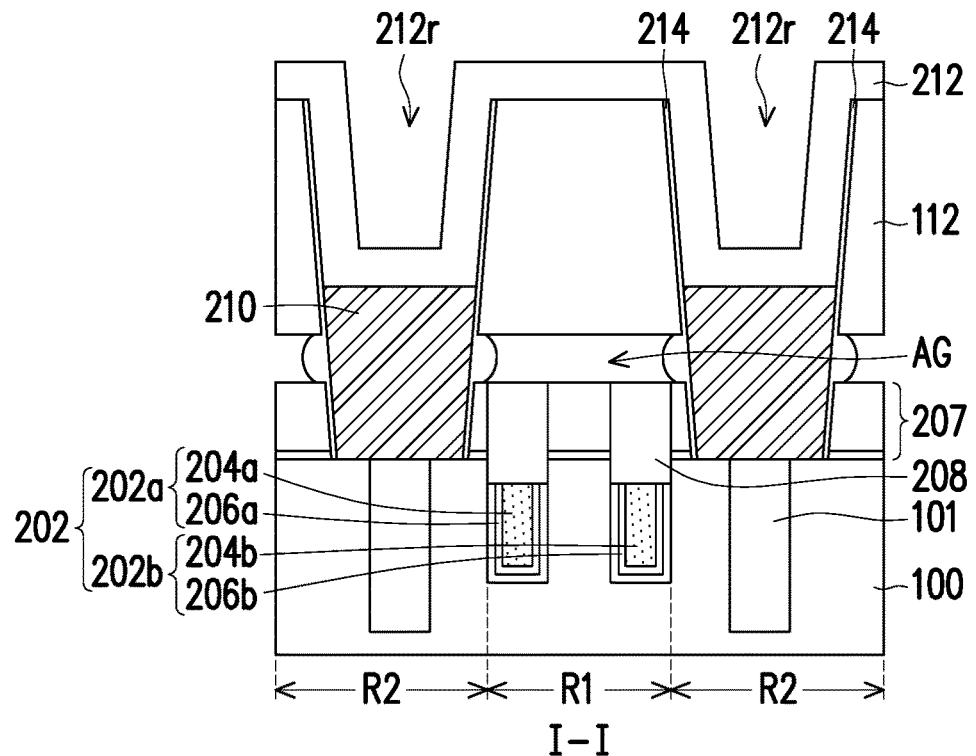
Figure 2L:
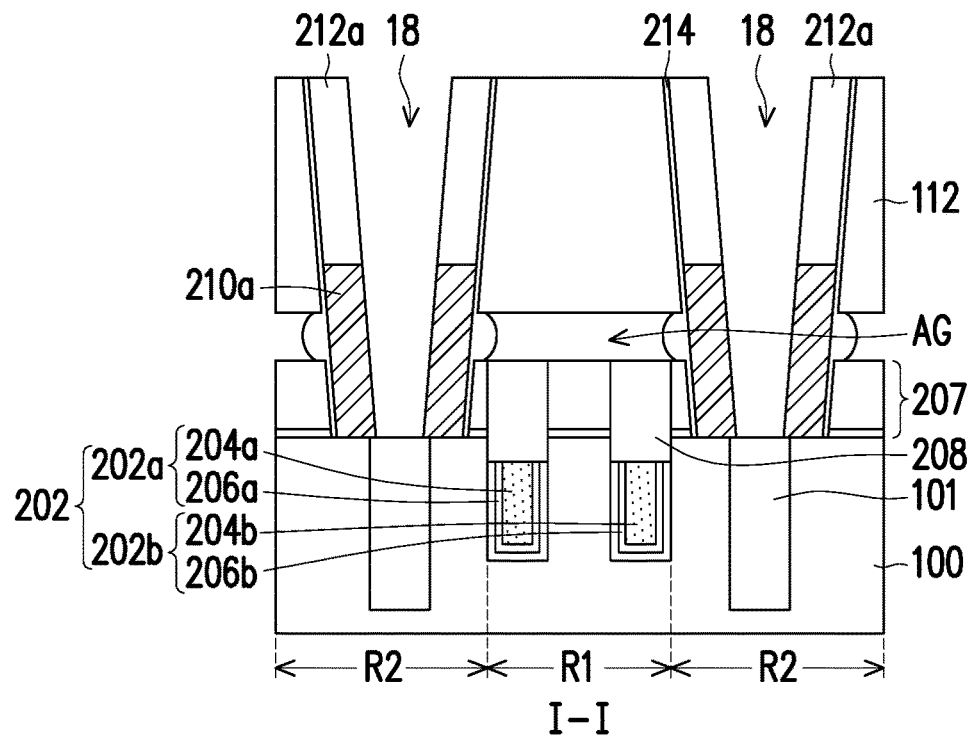
Figure 2M:
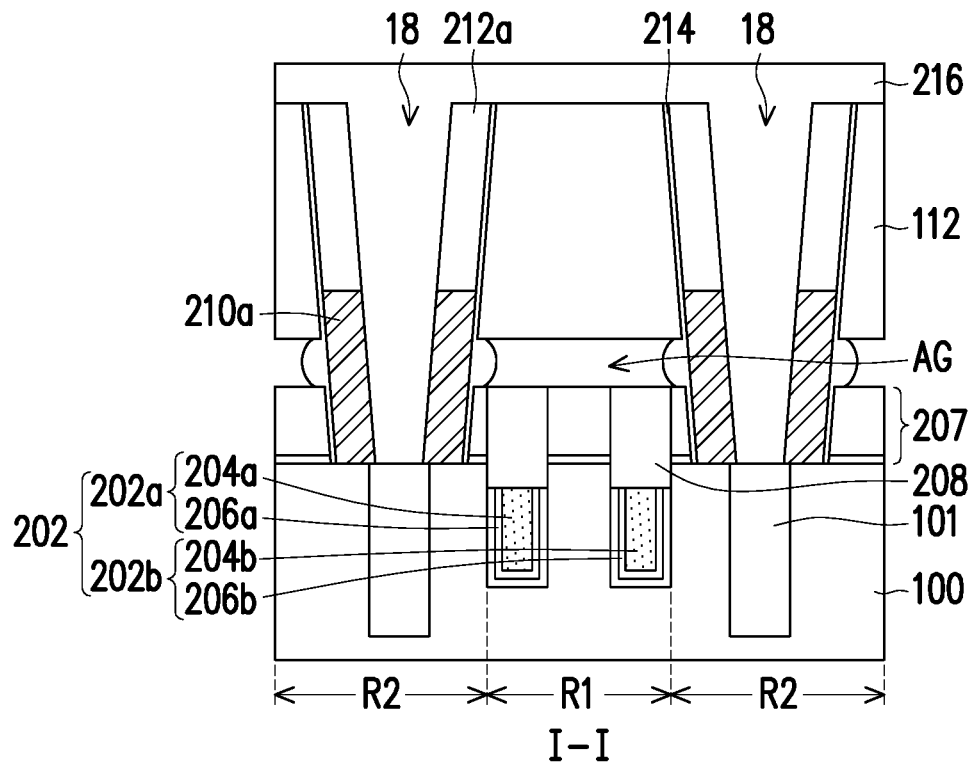

As shown in FIG. 2K, the dielectric layer 212 on the substrate 100 in the second regions R2 has a recess opening 212r, and the recess opening 212r corresponds to the isolation structure 101 in the substrate 100. In an embodiment, a material of the dielectric layer 212 may include silicon oxide, silicon nitride, silicon oxynitride, or a combination thereof.

Referring to FIG. 1L, FIG. 2L, FIG. 3L, and FIG. 4L, a third etching process is performed to remove a portion of the dielectric layer 212 and a portion of the conductive layer 210, so as to form openings 18 in the conductive pillars 210a and the dielectric pillars 212a of the second regions R2. The opening 18 exposes the surface of the isolation structure 101 in the second regions R2. In addition, during the third etching process, the dielectric layer 212 in the first regions R1 is removed to expose the top surface of the dielectric layer 112. On the other hand, the opening 18 separates a conductive layer 210 (FIG. 2K) into two conductive pillars 210a. In one embodiment, since the opening 18 can be aligned with the isolation structure 101 in the second regions R2 without using the lithography process, the opening 18 can be regarded as a self-aligned opening. In one embodiment, the third etching process includes a dry etching process, such as an RIE process.

Referring to FIG. 1M, FIG. 2M, FIG. 3M, and FIG. 4M, a dielectric material 216 is formed on the substrate 100. The dielectric material 216 is filled in the opening 18 and covers the top surfaces of the dielectric pillars 212a and the top surface of the dielectric layer 112. In one embodiment, the dielectric material 216 includes silicon oxide, silicon nitride, silicon oxynitride, or a combination thereof.

Figure 5:
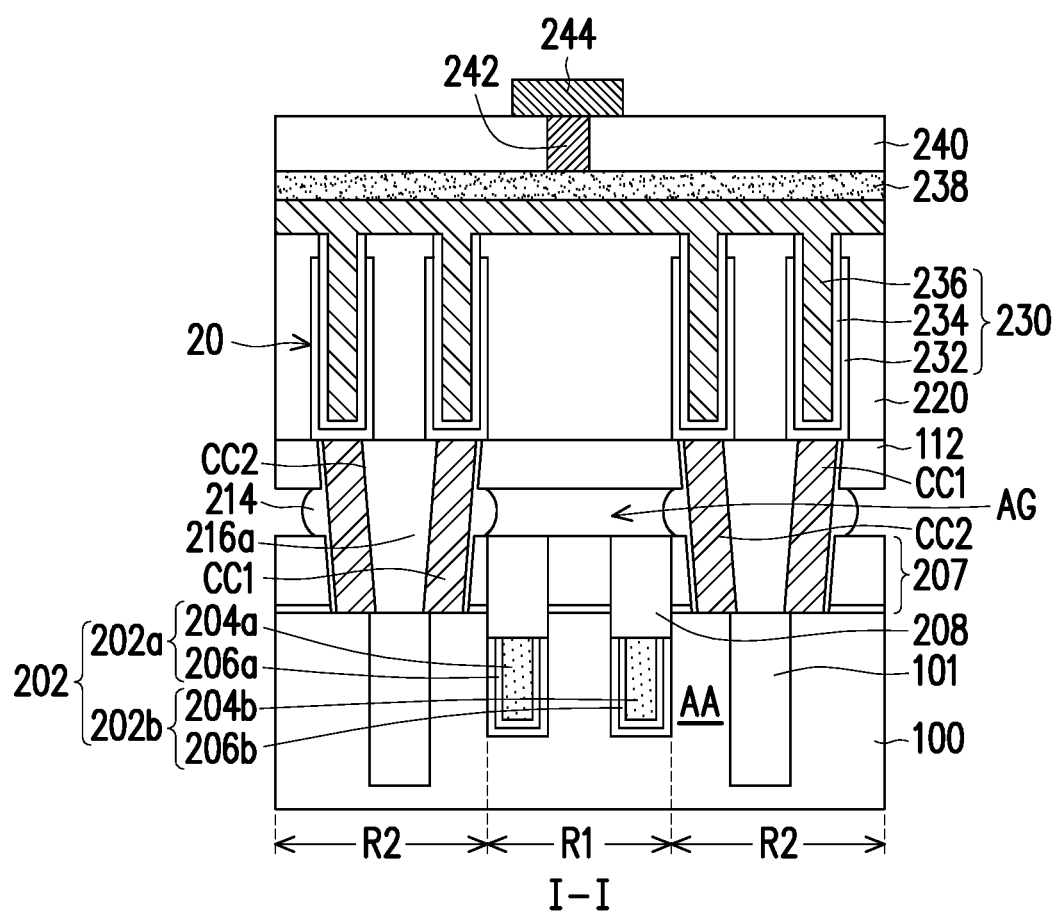
FIG. 5 is a schematic cross-sectional view of a memory device according to another embodiment of the invention.

Referring to FIG. 1N, FIG. 2N, FIG. 3N, and FIG. 4N, a planarization process is performed to remove a portion of the dielectric material 216, a portion of the dielectric layer 112, a portion of the spacers 214, and the dielectric pillars 212a, so as to expose the top surfaces of the conductive pillars 210a. In one embodiment, the planarization process may be a chemical mechanical polishing (CMP) process. In this case, as shown in FIG. 2N, the remaining dielectric material (also referred to as a dielectric structure) 216a is aligned with the underlying isolation structure 101 to form a self-aligned isolation structure. The self-aligned isolation structure separates the two conductor pillars 210a from each other, so that the two conductor pillars 210a are respectively arranged at both ends of the active area AA. In this embodiment, two adjacent conductor pillars 210a may be regarded as capacitor contacts CC1 and CC2. As shown in FIG. 1N, the capacitor contact CC1 is arranged at one end of the active area AA to electrically connect the active area AA and the capacitor 230 formed subsequently (as shown in FIG. 5). The capacitor contact CC2 is arranged at another end of the active area AA to electrically connect the active area AA and another capacitor 230 formed subsequently (as shown in FIG. 5).

It should be noted that, as the integration density of dynamic random access memory (DRAM) continues to increase, the coupling interference between the bit-line structures 102 would also increases. In order to solve the above problem, as shown in FIG. 4N, in the present embodiment, the air gaps AG (the dielectric constant k=1) may be formed between the bit-line structures 102 by the above forming method. The top surfaces of the air gaps AG may be higher than or equal to the top surfaces of the bit lines 104 in the bit-line structures 102, so as to effectively reduce the parasitic capacitance between the bit-line structures 102, thereby improving the coupling interference between the bit-line structures 102, and enhancing the reliability of DRAM. As shown in FIG. 1N, the air gap AG may be disposed in the space enclosed by the bit-line structures 102 and the capacitor contacts CC1 and CC2. In this embodiment, a width of each air gap AG is within a width of the corresponding word-line set 202. That is, the air gap AG will not exceed the range of the corresponding word-line set 202. In addition, the air gap AG will not exceed the range of adjacent bit-line structures 102.

FIG. 5 is a schematic cross-sectional view of a memory device according to another embodiment of the invention.

Referring to FIG. 5, following the structure of FIG. 2N, after forming the capacitor contacts CC1 and CC2, a dielectric layer 220 is formed on the substrate 100. Thereafter, a plurality of capacitor openings 20 are formed in the dielectric layer 220, and a plurality of capacitors 230 are formed in the capacitor openings 20, respectively. The capacitors 230 are electrically connected to the active areas AA through the capacitor contacts CC1 and CC2, respectively. Specifically, each capacitor 230 includes a lower electrode 232, an upper electrode 236, and a capacitor dielectric layer 234. The lower electrodes 232 are cup-shaped and are electrically connected to the capacitor contacts CC1 and CC2, respectively. The capacitor dielectric layer 234 is disposed between the lower electrode 232 and the upper electrode 236, and conformally extends along the inner surface of the lower electrode 232. In one embodiment, the top surface of the capacitor dielectric layer 234 is higher than the top surface of the lower electrode 232 to electrically separate the lower electrode 232 from the upper electrode 236. The upper electrode 236 extends from the capacitor openings 20 to cover the top surface of the dielectric layer 220. In other words, two adjacent capacitors 230 share the same upper electrode 236. In an embodiment, a material of the lower electrode 232 includes a conductive material, such as Ti, TiN, or a combination thereof. The capacitor dielectric layer 234 may include a high dielectric constant material layer (i.e., a dielectric material with a dielectric constant greater than 4), and a material thereof includes, for example, oxides of the following elements, such as hafnium, zirconium, aluminum, titanium, lanthanum, yttrium, gadolinium, tantalum or aluminum nitride or any combination of the elements. A material of the upper electrode 236 includes a conductive material, such as polysilicon. A material of the dielectric layer 220 may include silicon oxide, silicon nitride, silicon oxynitride, or a combination thereof.

After forming the capacitor 230, the method further includes: forming a conductive layer 238 on the upper electrode 236; forming a dielectric layer 240 on the conductive layer 238; forming a metal plug 242 in the dielectric layer 240; and forming a conductive layer 244 on the metal plug 242. In one embodiment, a material of the conductive layer 238 includes a metal material, such as tungsten. A material of the dielectric layer 240 may include silicon oxide. A material of the metal plug 242 may include a metal material, such as tungsten. A material of the conductive layer 244 may include a metal material, such as aluminum, copper, aluminum copper, or a combination thereof. In this embodiment, the conductive layer 244 may be regarded as the first metal layer (Metal 1), which is electrically connected to the upper electrode 236 through the metal plug 242 and the conductive layer 238.

In summary, in the embodiment of the present invention, the air gaps are formed between the bit-line structures to effectively reduce the parasitic capacitance between the bit-line structures, thereby improving the coupling interference between the bit-line structures and enhancing the reliability of the DRAM.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A dynamic random access memory (DRAM), comprising:
   a substrate having a plurality of active areas;
   a plurality of word-line sets extending along a Y direction and disposed in the substrate;
   a plurality of bit-line structures extending along a X direction, disposed on the substrate, and across the plurality of word-line sets;
   a plurality of capacitors respectively disposed at two terminals of the plurality of active areas;
   a plurality of capacitor contacts respectively disposed between the plurality of capacitors and the plurality of active areas; and
   a plurality of air gaps respectively disposed in a plurality of spaces enclosed by the plurality of bit-line structures and the plurality of capacitor contacts, wherein an area of each air gap projected on a top surface of the substrate overlaps with an area of a corresponding word-line set projected on the top surface of the substrate, wherein each air gap laterally extends an entire length between two adjacent spacers, which physically separate each air gap from two respectively adjacent capacitor contacts.

2. The DRAM according to claim 1, wherein each word-line set comprises two embedded word lines.

3. The DRAM according to claim 1, wherein each air gap has a width which is within a width of a corresponding word-line set.

4. The DRAM according to claim 1, wherein each capacitor comprises:
   a lower electrode being cup-shaped;
   an upper electrode disposed on the lower electrode; and
   a capacitor dielectric layer disposed between the lower and upper electrodes.

5. The DRAM according to claim 4, wherein two adjacent capacitors share a same upper electrode.

6. A method of forming a dynamic random access memory (DRAM), comprising:
   providing a substrate having a plurality of active areas;
   forming a plurality of word-line sets in the substrate;
   forming a plurality of bit-line structures on the substrate;
   forming a sacrificial layer between the plurality of bit-line structures;
   forming a first dielectric layer on the sacrificial layer;
   forming a plurality of trenches in the first dielectric layer to expose the sacrificial layer;
   performing a first etching process to remove the sacrificial layer, so as to form a plurality of air gaps under the first dielectric layer between the plurality of bit-line structures;
   forming spacers on sidewalls of the plurality of trenches to seal the plurality of air gaps;
   respectively forming a plurality of capacitor contacts on two terminals of the plurality of active areas; and
   respectively forming a plurality of capacitors on the plurality of capacitor contacts, wherein an area of each air gap projected on a top surface of the substrate overlaps with an area of a corresponding word-line set projected on the top surface of the substrate, wherein each air gap laterally extends an entire length between two adjacent spacers, which physically separate each air gap from two respectively adjacent capacitor contacts.

7. The method of forming the DRAM according to claim 6, wherein the forming the spacers comprises:
   filling the plurality of trenches with a second dielectric layer; and
   performing a second etching process to remove a portion of the second dielectric layer, so as to expose the top surface of the substrate, wherein the spacers cover the sidewalls of the plurality of trenches and extend into a position under the first dielectric layer.

8. The method of forming the DRAM according to claim 6, wherein each word-line set comprises two embedded word lines.

9. The method of forming the DRAM according to claim 8, wherein before forming the plurality of word-line sets, the method further comprises forming a plurality of isolation structures in the substrate to divide the substrate into the plurality of active areas, wherein the plurality of active areas are configured as strips and arranged in an array.

10. The method of forming the DRAM according to claim 9, wherein the forming the plurality of capacitor contacts comprises:
   forming a plurality of conductive layers in the plurality of trenches, wherein a top surface of the plurality of conductive layers is lower than a top surface of the first dielectric layer;
   forming a third dielectric layer to conformally cover the first dielectric layer and the plurality of conductive layers, wherein the third dielectric layer is a continuous uneven structure;
   performing a third etching process to form a plurality of openings exposing the plurality of isolation structures, wherein the plurality of openings divide the plurality of conductive layers into the plurality of capacitor contacts; and
   forming a plurality of dielectric structures in the plurality of openings to connect the plurality of isolation structures.

* * * * *